(12) United States Patent
Park et al.

(10) Patent No.: US 11,374,067 B2
(45) Date of Patent: Jun. 28, 2022

(54) DISPLAY DEVICE

(71) Applicant: Samsung Display Co., Ltd., Yongin-si (KR)

(72) Inventors: Yong-Hwan Park, Cheonan-si (KR); Miyoung Kim, Hwaseong-si (KR); Soyeon Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/024,015

(22) Filed: Sep. 17, 2020

(65) Prior Publication Data

US 2021/0118958 A1 Apr. 22, 2021

(30) Foreign Application Priority Data

Oct. 16, 2019 (KR) .......................... 10-2019-0128560

(51) Int. Cl.
*H01L 27/32* (2006.01)
*G06F 3/041* (2006.01)
(Continued)

(52) U.S. Cl.
CPC .......... *H01L 27/323* (2013.01); *G06F 3/0412* (2013.01); *G06F 3/04164* (2019.05); *H01L 27/3276* (2013.01); *G06F 3/0446* (2019.05); *G06F 2203/04102* (2013.01); *H01L 51/0097* (2013.01); *H01L 51/5253* (2013.01)

(58) Field of Classification Search
CPC . H01L 27/323; H01L 27/3276; H01L 27/124; H01L 27/1218; H01L 51/0097; H01L 51/5253; H01L 51/5203; G06F 3/04164; G06F 3/041; G06F 3/0412; G06F 3/0446; G06F 3/044; G06F 2203/04102
See application file for complete search history.

(56) References Cited

U.S. PATENT DOCUMENTS 10,056,446 B2 * 8/2018 Kim ..................... H01L 27/3276
10,180,745 B2 * 1/2019 Shao ..................... G06F 3/0443
(Continued)

FOREIGN PATENT DOCUMENTS

CN 108681415 A 10/2018
EP 3460622 A2 3/2019
(Continued)

OTHER PUBLICATIONS

EPO Extended Search Report dated Mar. 15, 2021, issued in corresponding European Patent Application No. 20199335.9 (8 pages).

*Primary Examiner* — Sardis F Azongha
(74) *Attorney, Agent, or Firm* — Lewis Roca Rothgerber Christie LLP

(57) ABSTRACT

A display device includes: a display panel including a plurality of pixels and a plurality of panel lines connected to the pixels; a plurality of sensing electrodes on the display panel; a plurality of sensing lines connected to the sensing electrodes on the display panel; and a plurality of pads connected to the panel lines and the sensing lines, wherein, at a fan-out part between the pixels and the pads, the panel lines are grouped into a plurality of first line groups, the sensing lines are grouped into a plurality of second line groups, and the first line groups and the second line groups are alternately arranged.

22 Claims, 19 Drawing Sheets

(51) Int. Cl.
    *G06F 3/044*     (2006.01)
    *H01L 51/00*     (2006.01)
    *H01L 51/52*     (2006.01)

(56) References Cited

U.S. PATENT DOCUMENTS

| | | | |
|---|---|---|---|
| 2017/0288008 A1* | 10/2017 | Kim | H01L 51/0097 |
| 2018/0239477 A1 | 8/2018 | Yang et al. | |
| 2019/0095007 A1* | 3/2019 | Jeong | G06F 3/0446 |
| 2021/0011572 A1* | 1/2021 | Kim | G06F 3/04166 |
| 2021/0124206 A1* | 4/2021 | Li | G02F 1/1345 |

FOREIGN PATENT DOCUMENTS

| | | |
|---|---|---|
| KR | 10-2014-0050831 A | 4/2014 |
| KR | 10-2014-0100091 A | 8/2014 |
| KR | 10-2016-0150630 A | 12/2016 |
| KR | 10-2018-0099608 A | 9/2018 |

\* cited by examiner

US 11,374,067 B2

DISPLAY DEVICE

CROSS-REFERENCE TO RELATED APPLICATION

This application claims priority to and the benefit of Korean Patent Application No. 10-2019-0128560, filed on Oct. 16, 2019, the entire contents of which are hereby incorporated by reference.

BACKGROUND

1. Field

Aspects of some example embodiments of the present disclosure relate to a display device.

2. Description of the Related Art

Electronic devices such as smart phones, digital cameras, notebook computers, navigation devices, and smart televisions that provide images to a user include display devices for displaying images. The display device includes a display panel for generating an image and an input device such as an input sensing portion (e.g., an input sensor or touch panel).

The input sensing portion may be located, for example, on the display panel and may detect a user's touch (e.g., by the user's finger, a stylus, etc.). The signal detected by the input sensing portion may be converted into an input signal. The display panel may then display an image to the user that corresponds to the input signal detected by the input sensing portion.

The display panel may include a plurality of pixels, a plurality of panel lines connected to the pixels, and a plurality of panel pads connected to the panel lines. The input sensing portion may include a plurality of sensing electrodes, a plurality of sensing lines connected to the sensing electrodes, and a plurality of sensing pads connected to the sensing lines.

The panel pads and sensing pads are connected to a timing controller that controls the operation of the display panel and an input sensing controller that controls the operation of the input sensing portion. The timing controller and input sensing controller may be mounted on a printed circuit board and connected to the panel pads and the sensing pads.

The above information disclosed in this Background section is only for enhancement of understanding of the background and therefore the information discussed in this Background section does not necessarily constitute prior art.

SUMMARY

Aspects of some example embodiments of the present disclosure relate to a display device, and for example, to a display device that can reduce the bezel area.

Aspects of some example embodiments of the present disclosure include a display device that can reduce the bezel area.

Aspects of some example embodiments of the inventive concept include a display device including: a display panel including a plurality of pixels and a plurality of panel lines connected to the pixels; a plurality of sensing electrodes on the display panel; a plurality of sensing lines connected to the sensing electrodes on the display panel; and a plurality of pads connected to the panel lines and the sensing lines, wherein in a fan-out part between the pixels and the pads, the panel lines are grouped into a plurality of first line groups, the sensing lines are grouped into a plurality of second line groups, and the first line groups and the second line groups are alternately arranged.

Aspects of some example embodiments of the inventive concept, a display device includes: a display panel including a plurality of pixels and a plurality of panel lines connected to the pixels; a plurality of sensing electrodes on the display panel; a plurality of sensing lines connected to the sensing electrodes on the display panel; a plurality of pads connected to the panel lines and the sensing lines; and a first power metal in a fan-out part between the pixels and the pads and connected to the pixels, wherein in the fan-out part, the panel lines are grouped into a plurality of first line groups and the sensing lines are grouped into a plurality of second line groups that partially overlap the first line groups, wherein in a plan view, the first power metal overlaps portions of the first and second line groups that overlap each other.

BRIEF DESCRIPTION OF THE DRAWINGS

The accompanying drawings are included to provide a further understanding of the inventive concept, and are incorporated in and constitute a part of this specification. The drawings illustrate aspects of some example embodiments of the inventive concept and, together with the description, serve to explain principles of embodiments according to the inventive concept. In the drawings:

FIG. 14 is a view illustrating a bent state of the bending area illustrated in

FIG. 13;

DETAILED DESCRIPTION

Figure 1:
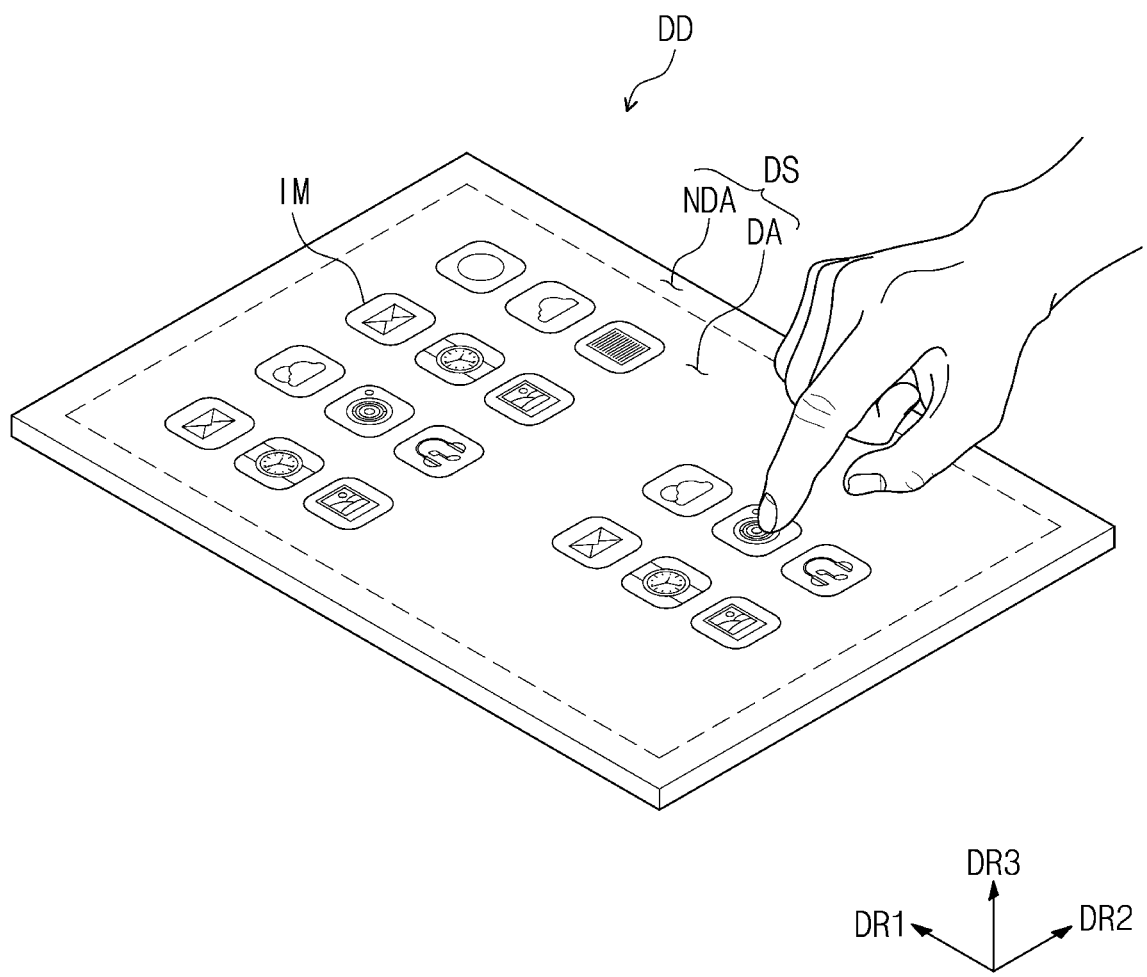
FIG. 1 is a perspective view of a display device according to some example embodiments of the inventive concept.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which this invention belongs. In general, the terms defined in the dictionary should be considered to have the same meaning as the contextual meaning of the related art, and, unless clearly defined herein, should not be understood abnormally or as having an excessively formal meaning.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept are described in more detail with reference to the accompanying drawings.

FIG. 1 is a perspective view of a display device according to some example embodiments of the inventive concept.

Referring to FIG. 1, a display device DD according to some example embodiments of the inventive concept may have a rectangular shape with long sides extending in the first direction DR1 and short sides extending in the second direction DR2 intersecting the first direction DR1. However, embodiments according to the inventive concept are not limited thereto, and the display device DD may have various shapes such as a circle or a polygon.

Hereinafter, the direction perpendicular (or substantially perpendicular) to the plane defined by the first direction DR1 and the second direction DR2 is defined as the third direction DR3. In addition, in the present specification, the meaning when viewed on a plane may refer to a state viewed from the third direction DR3.

The upper surface of the display device DD may be defined as the display surface DS and may have a plane defined by the first direction DR1 and the second direction DR2. The images IM generated by the display device DD may be provided or displayed to the user through the display surface DS.

The display surface DS may include a display area DA and a non-display area NDA around the display area DA. The display area DA may display an image, and the non-display area NDA may not display an image. The non-display area NDA may surround the display area DA and may define an outline of the display device DD printed in a color (e.g., a set or predetermined color).

The display device DD may be used, for example, for relatively large electronic devices such as televisions, monitors, or external billboards. In addition, the display device DD may be used, for example, in relatively small and medium-sized electronic devices such as personal computers, notebook computers, personal digital terminals, car navigation systems, game machines, smartphones, tablets, or cameras.

However, these are presented as example embodiments only and embodiments according to the present disclosure may be used for other electronic devices without departing from the concept of the inventive concept.

Figure 2:
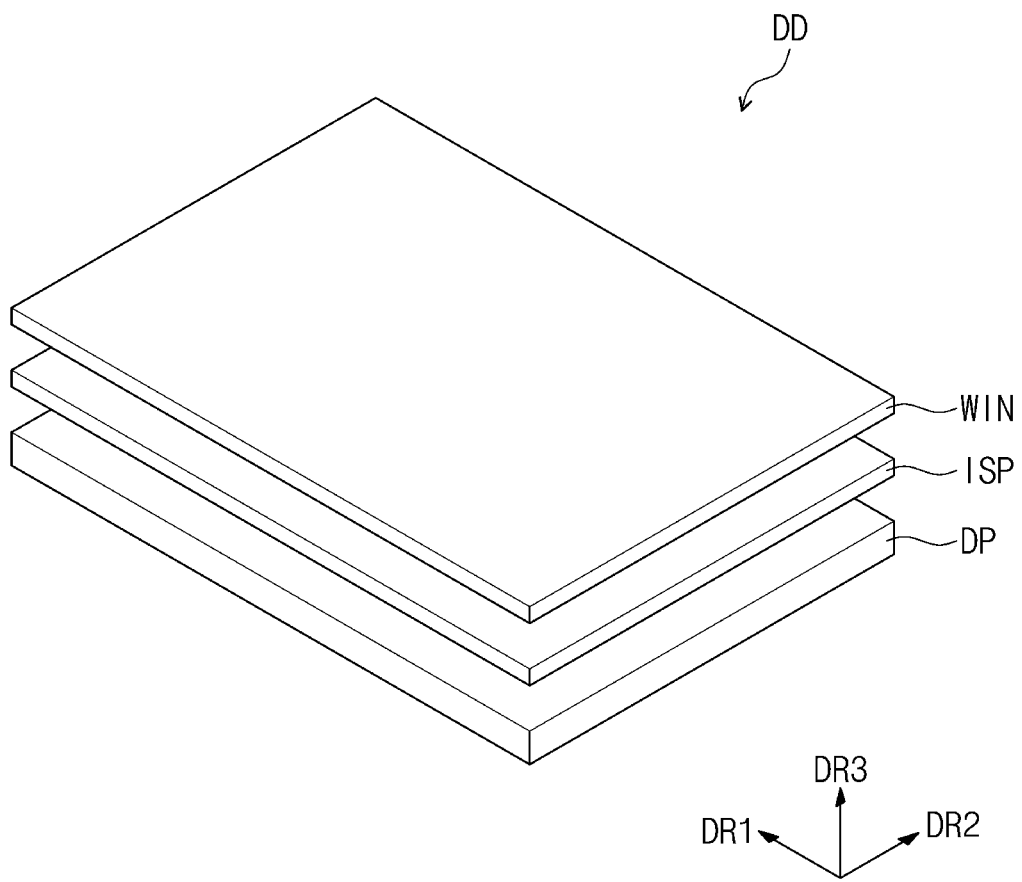
FIG. 2 is an exploded perspective view of the display device shown in FIG. 1.

FIG. 2 is an exploded perspective view of the display device shown in FIG. 1.

Referring to FIG. 2, the display device DD may include a display panel DP, an input sensing portion ISP located on the display panel DP, and a window WIN located on the input sensing portion ISP.

The display panel DP according to some example embodiments of the inventive concept may be a light emitting display panel, but example embodiments according to the present invention are not particularly limited. For example, the display panel DP may be an organic light emitting display panel or a quantum dot light emitting display panel. The light emitting layer of the organic light emitting display panel may include an organic light emitting material. The light emitting layer of the quantum dot light emitting display panel may include a quantum dot and a quantum rod. Hereinafter, the display panel DP is described in the context of an organic light emitting display panel, but embodiments according to the present disclosure are not limited thereto, and the display panel DP may be any suitable display panel.

The window WIN may protect the display panel DP and the input sensing portion ISP from external scratches and impacts. The window WIN may be attached to the input sensing portion ISP, for example, by an adhesive material. The adhesive material may include any suitable adhesive material, such as an optical clear adhesive or a pressure sensitive adhesive. The image generated by the display panel DP may be provided or displayed to the user through the window WIN and the input sensing portion ISP. That is, the input sensing portion ISP and the window WIN may be formed of transparent or translucent material and/or may allow light emitted by the display panel DP to pass therethrough.

The input sensing portion ISP may be manufactured directly on the display panel DP when the display module DM is manufactured. However, embodiments according to the inventive concept are not limited thereto, and the input sensing portion ISP may be manufactured as an input sensing panel separate from the display panel DP and then later attached to or mounted on the display panel DP, for example, by an adhesive material.

Figure 3:
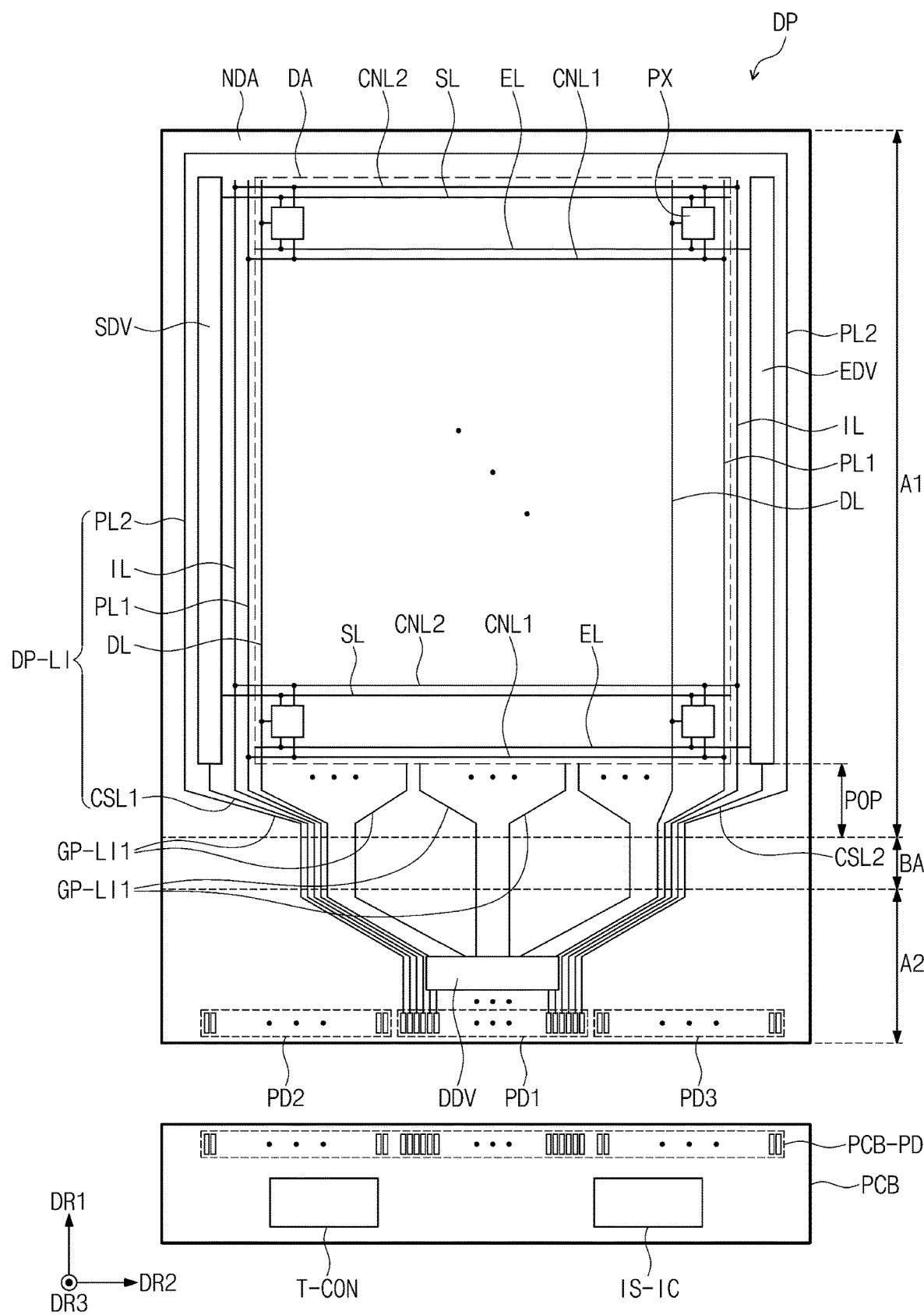
FIG. 3 is a plan view of the display panel shown in FIG. 2.

FIG. 3 is a plan view of the display panel shown in FIG. 2.

Referring to FIG. 3, the display device DD may include a display panel DP, a scan driver SDV, a data driver DDV, an emission driver EDV, a printed circuit board PCB, a timing controller T-CON, and an input sensing controller IS-IC.

The display panel DP may be a flexible display panel. For example, the display panel DP may include a plurality of electronic elements located on the flexible substrate. The display panel DP may have a rectangular shape having long sides extending in the first direction DR1 and short sides extending in the second direction DR2.

The display panel DP may include a first area A1, a second area A2, and a bending area BA between the first area A1 and the second area A2. The first area A1, the bending area BA, and the second area A2 may be arranged in the first direction DR1, and the bending area BA may extend in the second direction DR2.

The first area A1 may include a display area DA and a non-display area NDA around (e.g., surrounding or outside a footprint of) the display area DA. The non-display area NDA may surround the display area DA. The display area DA may be an area for displaying an image, and the non-display area NDA may be an area for not displaying an image. That is, the non-display area NDA may be an area within the first area A1 that is outside a footprint of or surrounding the display area DA. The second area A2 and the bending area BA may be areas that do not display an image. An area not displaying an image may be defined as (or include) a bezel area. The bending area BA may be bent so that the second area A2 may be located below (or behind) the first area A1.

The display panel DP may include a plurality of pixels PX, a plurality of scan lines SL, a plurality of data lines DL, a plurality of emission lines EL, first and second control lines. CSL1 and CSL2, a plurality of initialization lines IL, a plurality of first power lines PL1, a second power line PL2, a plurality of first connection lines CNL1, a plurality of second connection lines CNL2, and a plurality of pads PD1, PD2, and PD3.

The pixels PX may be located in the display area DA. The scan driver SDV, the data driver DDV, and the emission driver EDV may be located in the non-display area NDA. The scan driver SDV and the emission driver EDV may be located in the non-display areas NDA adjacent to the long sides of the display panel DP, respectively.

The data driver DDV may be manufactured in the form of an integrated circuit chip and located in the second area A2. However, embodiments according to the inventive concept are not limited thereto, and according to some example embodiments, the data driver DDV may be mounted on the flexible circuit board connected to the display panel DP, and may be connected to the display panel DP through the flexible circuit board. The data driver DDV may be defined as a driving chip.

The scan lines SL1 to SLm may extend in the second direction DR2 to be connected to the pixels PX and the scan driver SDV. The data lines DL1 to DLn may extend in the first direction DR1 to be connected to the pixels PX and the data driver DDV. The emission lines ELI to ELm may extend in the second direction DR2 and may be connected to the pixels PX and the emission driver EDV.

The first power lines PL1 may extend in the first direction DR1 to be located in the non-display area NDA. The first power lines PL1 may receive a first voltage. The first connection lines CNL1 may extend in the second direction DR2 to be connected to the first power lines PL1 and the pixels PX. The first voltage may be applied to the pixels PX through the first power lines PL1 and the first connection lines CNL1 connected to each other.

The initialization lines IL may extend in the first direction DR1 and may be located in the non-display area NDA. The initialization lines IL may receive an initialization voltage. The second connection lines CNL2 may extend in the second direction DR2 to be connected to the initialization lines IL and the pixels PX. The initialization voltage may be applied to the pixels PX through the initialization lines IL and the second connection lines CNL2 connected to each other. The pixels PX may be initialized by an initialization voltage.

The second power line PL2 may extend along the outline of the first area A1. The second power line PL2 may receive a second voltage. The second voltage may have a level lower than that of the first voltage. According to some example embodiments, the second voltage may be provided to the pixels PX through the second power line PL2.

The first control line CSL1 may be connected to the scan driver SDV. The second control line CSL2 may be connected to the emission driver EDV.

The pads PD1, PD2, and PD3 may be located on one side of the display panel DP. The pads PD1, PD2, and PD3 may be located in the second area A2. The fan-out part POP may be located between the pixels PX and the pads PD1, PD2, and PD3. The fan-out part POP may be defined as a part of the non-display area NDA between the bending area BA and the display area DA.

The pads PD1, PD2, and PD3 may include a plurality of first pads PD1, a plurality of second pads PD2, and a plurality of third pads PD3. The first pads PD1 may be located between the second pads PD2 and the third pads PD3.

The data lines DL, the first and second control lines CSL1 and CSL2, the initialization lines IL, the first power lines PL1, and the second power line PL2 may be defined as panel lines DP-LI. The panel lines DP-LI may be connected to the first pads PD1. For example, the data lines DL, the first and second control lines CSL1 and CSL2, the initialization lines IL, the first power lines PL1, and the second power line PL2 may be connected to the first pads PD1 in the second area A2 through the fan-out part POP and the bending area BA.

The first power lines PL1 may be substantially connected to the first power metal located in the fan-out part POP. This configuration will be described in more detail with respect to the enlarged view of the fan-out part POP shown in FIG. 9.

The data lines DL may be connected to the corresponding first pads PD1 of the first pads PD1 through the data driver DDV. For example, the data lines DL may be connected to the data driver DDV, and the data driver DDV may be connected to the first pads PD1 corresponding to the data lines DL. For example, the data lines DL may be connected to the pixels PX and the data driver DDV, and the data lines DL may be connected to the data driver DDV and the first pads PD1.

In the fan-out part POP, the panel lines DP-LI may be grouped into a plurality of first line groups GP-LI1. For example, each of the first line groups GP-LI1 may include at least two panel lines DP-LI. For example, three first line groups GP-LI1 are illustrated, but the number of first line groups GP-LI1 is not limited thereto. The first line groups GP-LI1 may be spaced apart from each other in the second direction DR2.

The panel lines DP-LI of each of the first line groups GP-LI1 may be arranged in a fan shape in the fan-out part POP. For example, in the fan-out part POP, the interval or distance between the panel lines DP-LI of each of the first line groups GP-LI1 may become narrower as it goes from the display area DA to the bending area BA. The arrangement of such panel lines DP-LI will be shown in FIGS. 9 and 10 below.

The panel lines DP-LI of each of the first line groups GP-LI1 may extend in the first direction DR1 in the bending area BA. The first line groups GP-LI1 may be spaced apart from each other in the second direction DR2 in the bending area BA.

The second pads PD2 and the third pads PD3 may be connected to sensing lines of the input sensing portion ISP, and this configuration will be described in more detail below.

The timing controller T-CON and the input sensing controller IS-IC may be located on the printed circuit board PCB. Each of the timing controller T-CON and the input sensing controller IS-IC may be manufactured as an integrated circuit chip and mounted on the printed circuit board PCB.

The plurality of pads PCB-PD may be located on one side of the printed circuit board PCB, and the pads PCB-PD may be connected to the first, second, and third pads PD1, PD2, and PD3. The plurality of pads PCB-PD may be located on one side of the printed circuit board PCB, and the pads PCB-PD may be connected to the first, second, and third pads PD1, PD2, and PD3.

The timing controller T-CON may control operations of the scan driver SDV, the data driver DDV, and the emission driver EDV. The timing controller T-CON may generate a scan control signal, a data control signal, and an emission control signal in response to control signals received from the outside.

The scan control signal may be provided to the scan driver SDV through the first control line CSL1. The emission control signal may be provided to the emission driver EDV through the second control line CSL2. The data control signal may be provided to a data driver DDV. The timing controller T-CON receives the image signals from the outside, and converts the data format of the image signals to match the interface specification with the data driver DDV, and provides the converted image data to the data driver DDV.

The scan driver SDV may generate a plurality of scan signals in response to the scan control signal. Scan signals may be applied to the pixels PX through the scan lines SL. Scan signals may be sequentially applied to the pixels PX.

The data driver DDV may generate a plurality of data voltages corresponding to the image signals in response to the data control signal. The data voltages may be applied to the pixels PX through the data lines DL. The emission driver EDV may generate a plurality of emission signals in response to the emission control signal. The emission signals may be applied to the pixels PX through the emission lines EL.

The pixels PX may be provided with data voltages in response to scan signals. The pixels PX can display an image by emitting light of a luminance corresponding to the data voltages. The emission time of the pixels PX may be controlled by emission signals.

Figure 4:
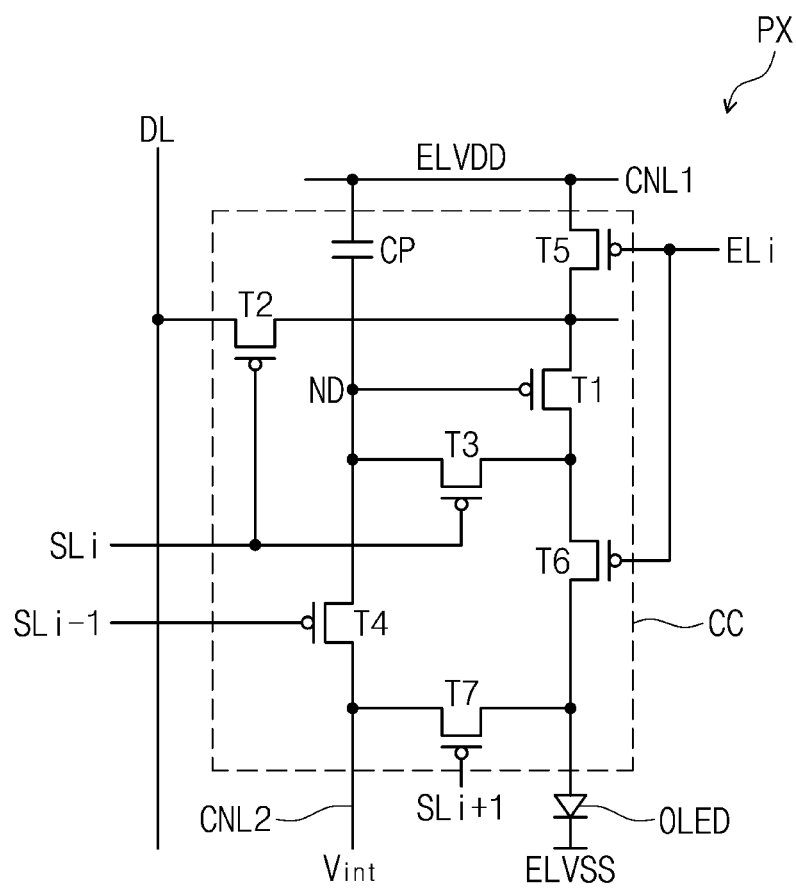
FIG. 4 is a diagram illustrating an equivalent circuit of one pixel illustrated in FIG. 3.

FIG. 4 is a diagram illustrating an equivalent circuit of one pixel illustrated in FIG. 3. Although FIG. 4 illustrates various transistors and capacitors included as part of the pixel circuit of a pixel PX, embodiments according to the present disclosure are not limited thereto, and according to some example embodiments, the pixel circuit may include fewer or additional transistors, capacitors, or other electronic circuit components, without departing from the spirit and scope of embodiments according to the present disclosure.

Referring to FIG. 4, the pixel PX may include a light emitting element OLED and a pixel circuit CC. The pixel circuit CC may include a plurality of transistors T1 to T7 and a capacitor CP. The pixel circuit CC may control the amount of current flowing through the light emitting element OLED in response to the data voltage.

The light emitting element OLED may emit light with a luminance (e.g., a set or predetermined luminance) corresponding to the amount of current provided from the pixel circuit CC. For this, the level of the first voltage ELVDD may be set higher than the level of the second voltage ELVSS.

Each of the transistors T1 to T7 may include an input electrode (or a source electrode), an output electrode (or a drain electrode), and a control electrode (or a gate electrode). In the specification, for convenience, either the input electrode or the output electrode may be referred to as a first electrode and the other may be referred to as a second electrode.

The first electrode of the first transistor T1 may receive the first voltage ELVDD through the fifth transistor T5 and the second electrode may be connected to the anode electrode of the light emitting element OLED through the sixth transistor T6. The first transistor T1 may be defined as a driving transistor. The first transistor T1 may control the amount of current flowing through the light emitting element OLED according to the voltage applied to the control electrode of the first transistor T1.

The second transistor T2 may be connected between the data line DL and the first electrode of the first transistor T1, and the control electrode of the second transistor T2 may be connected to the i-th scan line SLi. The second transistor T2 may be turned on by receiving the i-th scan signal through the i-th scan line SLi to electrically connect the data line DL and the first electrode of the first transistor T1.

The third transistor T3 may be connected between the second electrode and the control electrode of the first transistor T1. The control electrode of the third transistor T3 may be connected to the i-th scan line SLi. The third transistor T3 may be turned on by receiving the i-th scan signal through the i-th scan line SLi to electrically connect the second electrode and the control electrode of the first transistor T1. When the third transistor T3 is turned on, the first transistor T1 may be connected in the form of a diode.

The fourth transistor T4 may be connected between the node ND and the second connection line CNL2 connected to the initialization line IL. The control electrode of the fourth transistor T4 may be connected to the (i−1)-th scan line SLi−1. The fourth transistor T4 may be turned on by receiving the (i−1)-th scan signal through the (i−1)-th scan line SLi−1 to provide the initialization voltage Vint to the node ND. The initialization voltage Vint may be provided to the fourth transistor T4 through the initialization line IL and the second connection line CNL2.

The fifth transistor T5 may be connected between the first connection line CNL1 connected to the first power line PL1 and the first electrode of the first transistor T1. The control electrode of the fifth transistor T5 may be connected to the i-th emission line ELi.

The sixth transistor T6 may be connected between the second electrode of the first transistor T1 and the anode electrode of the light emitting element OLED. The control electrode of the sixth transistor T6 may be connected to the i-th emission line ELi.

The seventh transistor T7 may be connected between the second connection line CNL2 and the anode electrode of the light emitting element OLED. The control electrode of the seventh transistor T7 may be connected to the (i+1)-th scan line SLi+1. The seventh transistor T7 receives the (i+1)-th scan signal through an (i+1)-th scan line SLi+1 and is turned on to provide an initialization voltage Vint to the anode electrode of the light emitting element OLED.

The capacitor CP may be located between the first connection line CNL1 and the node ND. The capacitor CP may store a data voltage. When the fifth transistor T5 and the sixth transistor T6 are turned on according to the voltage stored in the capacitor CP, the amount of current flowing through the first transistor T1 can be determined.

In FIG. 4, the transistors T1 to T7 are shown based on the PMOS. However, embodiments according to the inventive concept are not limited thereto and according to some example embodiments of the inventive concept, the transistors T1 to T7 may be NMOS.

Figure 5:
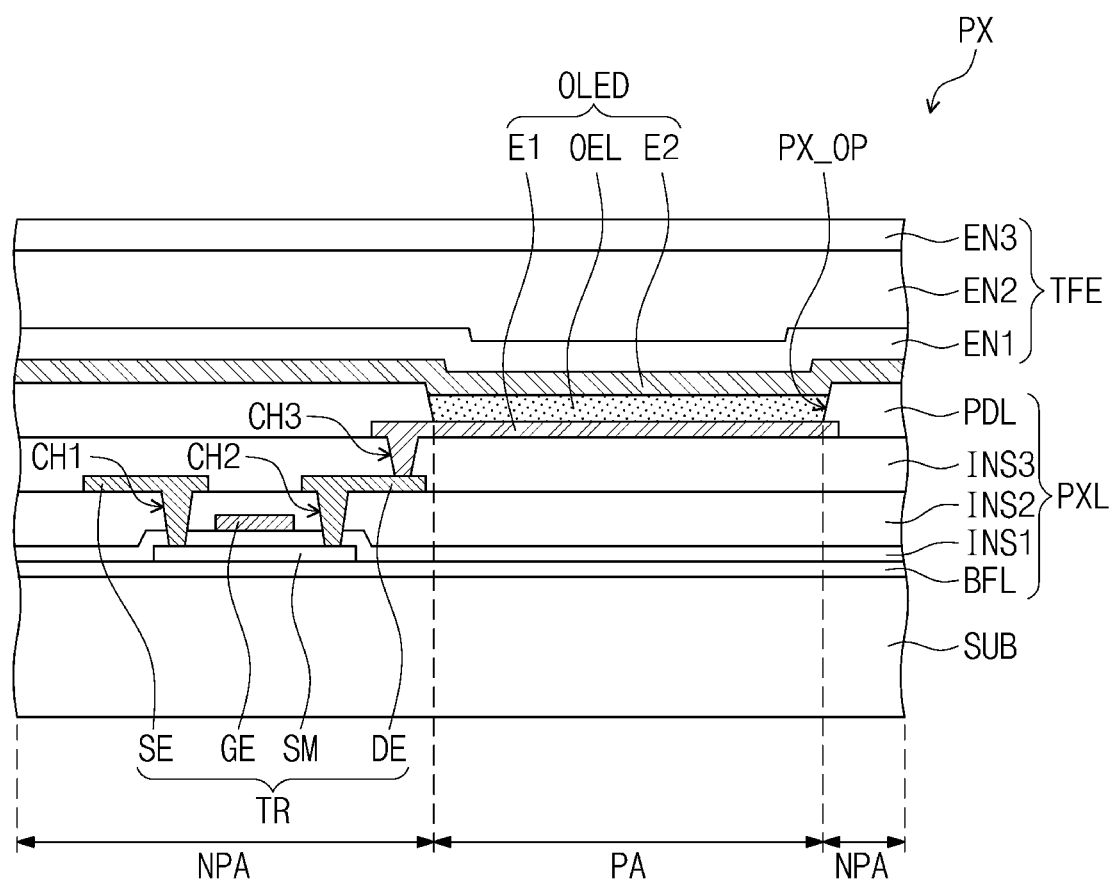
FIG. 5 is a cross-sectional view of a portion corresponding to the light emitting element shown in FIG. 4.

FIG. 5 is a cross-sectional view of a portion corresponding to the light emitting element shown in FIG. 4.

Referring to FIG. 5, the pixel PX may include a light emitting element OLED and a transistor TR connected to the light emitting element OLED. The light emitting element OLED may include a first electrode E1, a second electrode E2, and an organic light emitting layer OEL located between the first electrode E1 and the second electrode E2. The transistor TR may be a sixth transistor T6 shown in FIG. 4. The light emitting element OLED may be defined as an organic light emitting element.

The first electrode E1 may be an anode electrode, and the second electrode E2 may be a cathode electrode. The first electrode E1 may be defined as a pixel electrode, and the second electrode E2 may be defined as a common electrode.

The pixel PX may be divided into a pixel area PA and a non-pixel area NPA around the pixel area PA. The light emitting element OLED may be located in the pixel area PA, and the transistor TR may be located in the non-pixel area NPA.

The transistor TR and the light emitting element OLED may be located on the substrate SUB. The buffer layer BFL is located on the substrate SUB, and the buffer layer BFL may include an inorganic material.

The semiconductor layer SM of the transistor TR may be located on the buffer layer BFL. The semiconductor layer SM may include a semiconductor of an inorganic material such as amorphous silicon or poly silicon, or an organic semiconductor. Additionally, the semiconductor layer SM may include an oxide semiconductor. According to some example embodiments, the semiconductor layer SM may include a source area, a drain area, and a channel area between the source area and the drain area.

The first insulating layer INS1 may be located on the buffer layer BFL so as to cover the semiconductor layer SM. The first insulating layer INS1 may include an inorganic material. The gate electrode GE of the transistor TR overlapping the semiconductor layer SM may be located on the first insulating layer INS1. The gate electrode GE may be located to overlap the channel area of the semiconductor layer SM.

A second insulating layer INS2 may be located on the first insulating layer INS1 to cover the gate electrode GE. The second insulating layer INS2 may include an organic material and/or an inorganic material.

A source electrode SE and a drain electrode DE of the transistor TR may be spaced from each other and located on the second insulating layer INS2. The source electrode SE may be connected to the source area of the semiconductor layer SM through a first contact hole H1 that is defined in the first insulating layer INS1 and the second insulating layer INS2. The drain electrode DE may be connected to the drain area of the semiconductor layer SM through a second contact hole H2 that is defined in the first insulating layer INS1 and the second insulating layer INS2.

The third insulating layer INS3 may be located on the second insulating layer INS2 to cover the source electrode SE and the drain electrode DE of the transistor TR. The third insulating layer INS3 may be defined as a planarization film that provides a flat upper surface, and may include an organic material.

The first electrode E1 may be located on the third insulating layer INS3. The first electrode E1 may be connected to the drain electrode DE of the transistor TR through the third contact hole CH3 defined in the third insulating layer INS3.

The pixel defining film PDL exposing a portion (e.g., a set or predetermined portion) of the first electrode E1 may be located on the first electrode E1 and the third insulating layer INS3. An opening part PX_OP for exposing a portion (e.g., a set or predetermined) portion of the first electrode E1 may be defined in the pixel defining film PDL.

The organic light emitting layer OEL may be located on the first electrode E1 in the opening part PX_OP. The organic light emitting layer OEL may generate light of any one of red, green, and blue. However, embodiments according to the inventive concept are not limited thereto and the organic light emitting layer OEL may generate white light by a combination of organic materials generating red, green, and blue.

The second electrode E2 may be located on the pixel defining film PDL and the organic light emitting layer OEL. The thin film encapsulation layer TFE may be located on the pixel PX to cover the light emitting element OLED. The layer between the substrate SUB and the thin film encapsulation layer TFE may be defined as a pixel layer PXL.

The thin film encapsulation layer TFE may include a first encapsulation layer EN1 located on the light emitting element OLED, a second encapsulation layer EN2 located on the first encapsulation layer EN1, and a third encapsulation layer EN3 located on the second encapsulation layer EN2. Each of the first and third encapsulation layers EN1 and EN3 may include an inorganic material, and the second encapsulation layer EN2 may include an organic material. The thickness of the second encapsulation layer EN2 may be greater than the thickness of each of the first and third encapsulation layers EN1 and EN3.

The first voltage ELVDD may be applied to the first electrode E1, and the second voltage ELVSS may be applied to the second electrode E2. An exciton is formed as holes and electrons injected to the organic light emitting layer OEL are combined and the light emitting element (OLED) may emit light as the excitons transition to the ground state. The light emitting element OLED emits red, green, and blue light according to the flow of current, thereby displaying an image.

Figure 6:
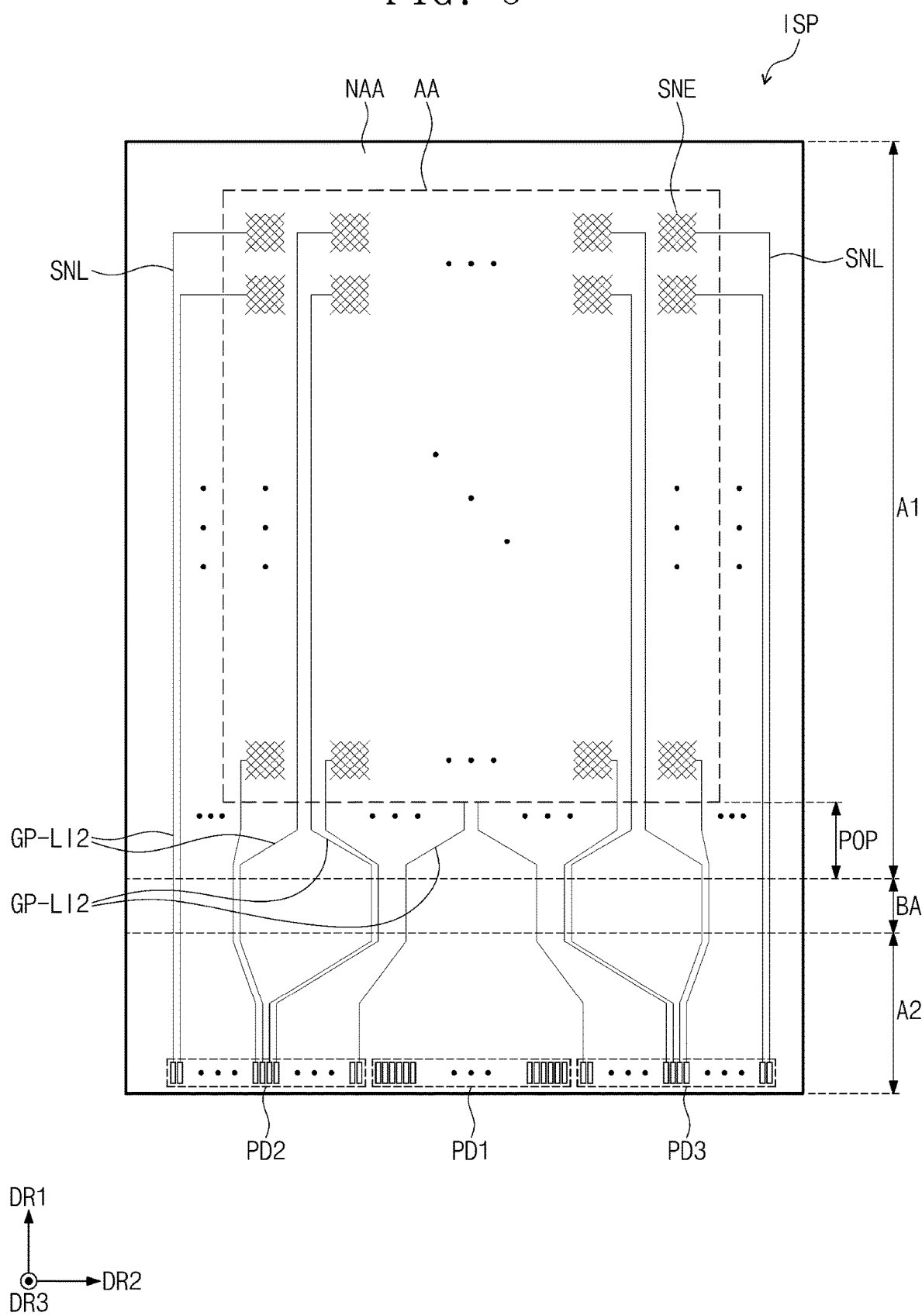
FIG. 6 is a plan view of an input sensing portion according to some example embodiments of the inventive concept.

FIG. 6 is a plan view of an input sensing portion according to some example embodiments of the inventive concept.

Referring to FIG. 6, the input sensing portion ISP may include a plurality of sensing electrodes SNE and a plurality of sensing lines SNL. The sensing electrodes SNE and the sensing lines SNL may be located on the thin film encapsulation layer TFE. The first, second, and third pads PD1, PD2, and PD3 shown in FIG. 6 may be the first, second, and third pads PD1, PD2, and PD3 of the display panel DP shown in FIG. 3.

The input sensing portion ISP may include a first area A1, a second area A2, and a bending area BA between the first area A1 and the second area A2, like the display panel DP. The first area A1 may include an active area AA and a non-active area NAA surrounding the active area AA. The active area AA can overlap the display area DA and the non-active area NAA can overlap the non-display area NDA. The fan-out part POP may be defined as a part of a non-active area NAA between the bending area BA and the active area AA.

The sensing electrodes SNE may be located in the active area AA. The sensing lines SNL may be connected to the sensing electrodes SNE and may extend to the second area A2 through the non-active area NAA and the bending area BA. The sensing lines SNL may be connected to the second and third pads PD2 and PD3 located in the second area A2.

The second and third pads PD2 and PD3 may be connected to an input sensing controller IS-IC of the printed circuit board PCB shown in FIG. 3. The input sensing controller IS-IC may control the operation of the input sensing portion ISP.

In the fan-out part POP, the sensing lines SNL may be grouped into a plurality of second line groups GP-LI2. For example, each of the second line groups GP-LI2 may include at least two sensing lines SNL. The number of second line groups GP-LI2 may be three or more. The second line groups GP-LI2 may be spaced apart from each other in the second direction DR2.

In the fan-out part POP, the interval between the sensing lines SNL of each of the second line groups GP-LI2 may become narrower as it goes from the display area DA to the bending area BA. The arrangement of such sensing lines SNL will be shown in FIGS. 9 and 10 below. The sensing lines SNL of each of the second line groups GP-LI2 may extend in the first direction DR1 in the bending area BA. The second line groups GP-LI2 may be spaced apart from each other in the second direction DR2 in the bending area BA.

The sensing electrodes SNE may have unique coordinate information. For example, the sensing electrodes SNE may be arranged in a matrix and connected to the sensing lines SNL, respectively. However, the arrangement of the sensing electrodes SNE is not particularly limited.

The input sensing portion ISP according to some example embodiments of the inventive concept may be driven in a self sensing mode to obtain coordinate information in a self-cap method. For example, the input sensing controller IS-IC may operate each of the sensing electrodes SNE as a driving electrode and a sensing electrode. The input sensing controller IS-IC may apply a driving signal to the sensing electrodes SE through the sensing lines SNL and receive a sensing signal from each of the sensing electrodes SNE.

The structure of the input sensing portion ISP illustrated in FIG. 6 is an example structure, and the structure of the input sensing portion ISP is not limited thereto. For example, the input sensing portion ISP may include a plurality of first sensing electrodes and a plurality of second sensing electrodes to have a structure for driving in a mutual sensing mode. Capacitances may be formed by the first sensing electrodes and the second sensing electrodes.

The second sensing electrodes may extend to be insulated from the first sensing electrodes and intersect the same. In the mutual sensing mode, the first sensing electrodes may be operated as driving electrodes, and the second sensing electrodes may be operated as sensing electrodes. The first sensing electrodes may be located on the same layer as the second sensing electrodes or on a different layer.

Figure 7:
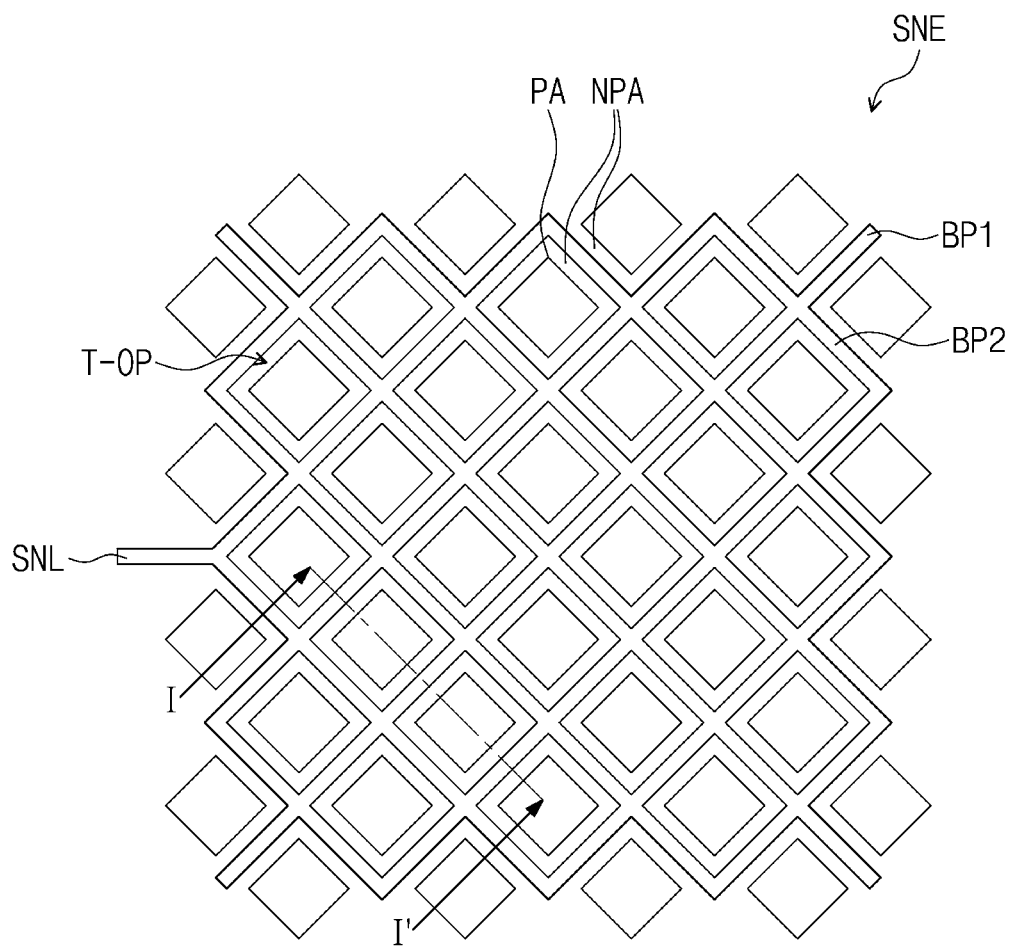
FIG. 7 is a diagram illustrating a configuration of any one sensing electrode illustrated in FIG. 6.
Figure 8:
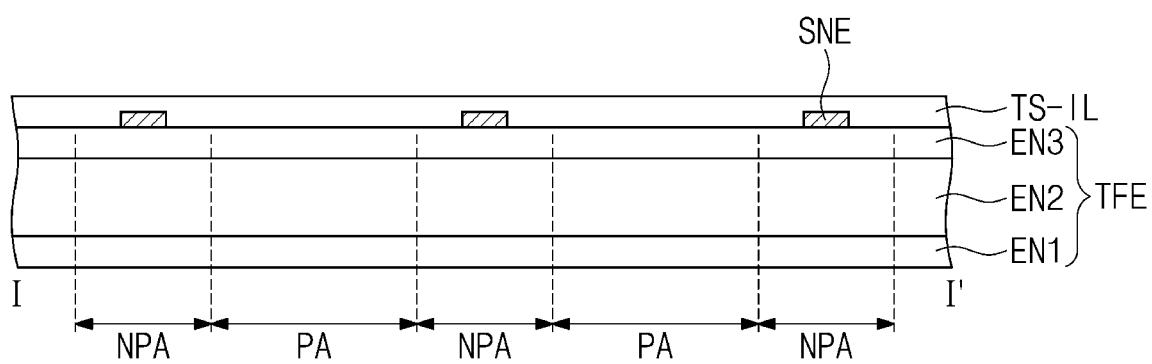
FIG. 8 is a cross-sectional view taken along the line I-I' of FIG. 7.

FIG. 7 is a diagram illustrating a configuration of any one sensing electrode illustrated in FIG. 6. FIG. 8 is a cross-sectional view taken along the line I-I' of FIG. 7.

FIGS. 7 and 8 illustrate the pixel areas PA and the non-pixel area NPA together.

Referring to FIG. 7, the sensing electrode SNE may have a mesh shape.

For example, the sensing electrode SNE may include a plurality of first branch parts BP1 extending in the first diagonal direction DDR1 and a plurality of second branch parts BP2 extending in the second diagonal direction DDR2.

The first diagonal direction DR1 may be defined as a direction intersecting the first and second directions DR1 and DR2 on a plane defined by the first and second directions DR1 and DR2. The second diagonal direction DDR2 may be defined as a direction intersecting the first diagonal direction DDR1 on a plane defined by the first and second directions DR1 and DR2. For example, the first direction DR1 and the second direction DR2 may perpendicularly intersect each other, and the first diagonal direction DR1 and the second diagonal direction DR2 may perpendicularly intersect each other.

The first branch parts BP1 may intersect the second branch parts BP2 and may be integrally formed with each other. The rhombus-shaped opening parts TOP may be defined by the first branch parts BP1 and the second branch parts BP2 that intersect each other. The first and second branch parts BP1 and BP2 may be defined by mesh lines, and the line width of each of the mesh lines may be several micrometers. The first and second branch parts BP1 and BP2 may include a metal.

The pixel areas PA may have a rhombus shape and overlap the opening parts TOP. The first and second branch parts BP1 and BP2 may be arranged to overlap the non-pixel area NPA. The pixel area PA shown in FIG. 5 may be any one of the pixel areas PA shown in FIG. 7.

The pixel areas PA may be defined as light emitting areas and the non-pixel area NPA may be defined as a non-light emitting area. Since the first and second branch parts BP1 and BP2 are located in the non-pixel area NPA, the light generated in the pixel areas PA may be normally emitted without being affected by the first and second branch parts BP1 and BP2.

Referring to FIG. 8, a sensing electrode SNE may be located on the thin film encapsulation layer TFE. The sensing electrode SNE may be directly located on the thin film encapsulation layer TFE to contact the thin film encapsulation layer TFE. The insulating layer TS-IL may be located on the thin film encapsulation layer TFE to cover the sensing electrode SNE.

According to some example embodiments, an insulating layer may be further located on the thin film encapsulation layer TFE. The first, second, and third encapsulation layers EN1, EN2, EN3 may be insulating layers, and the additional insulating layer may be located on the third encapsulation layer EN3. In this case, the sensing electrode SNE may be directly located on an insulating layer (additional insulating layer) located on the uppermost layer among the plurality of insulating layers.

Figure 9:
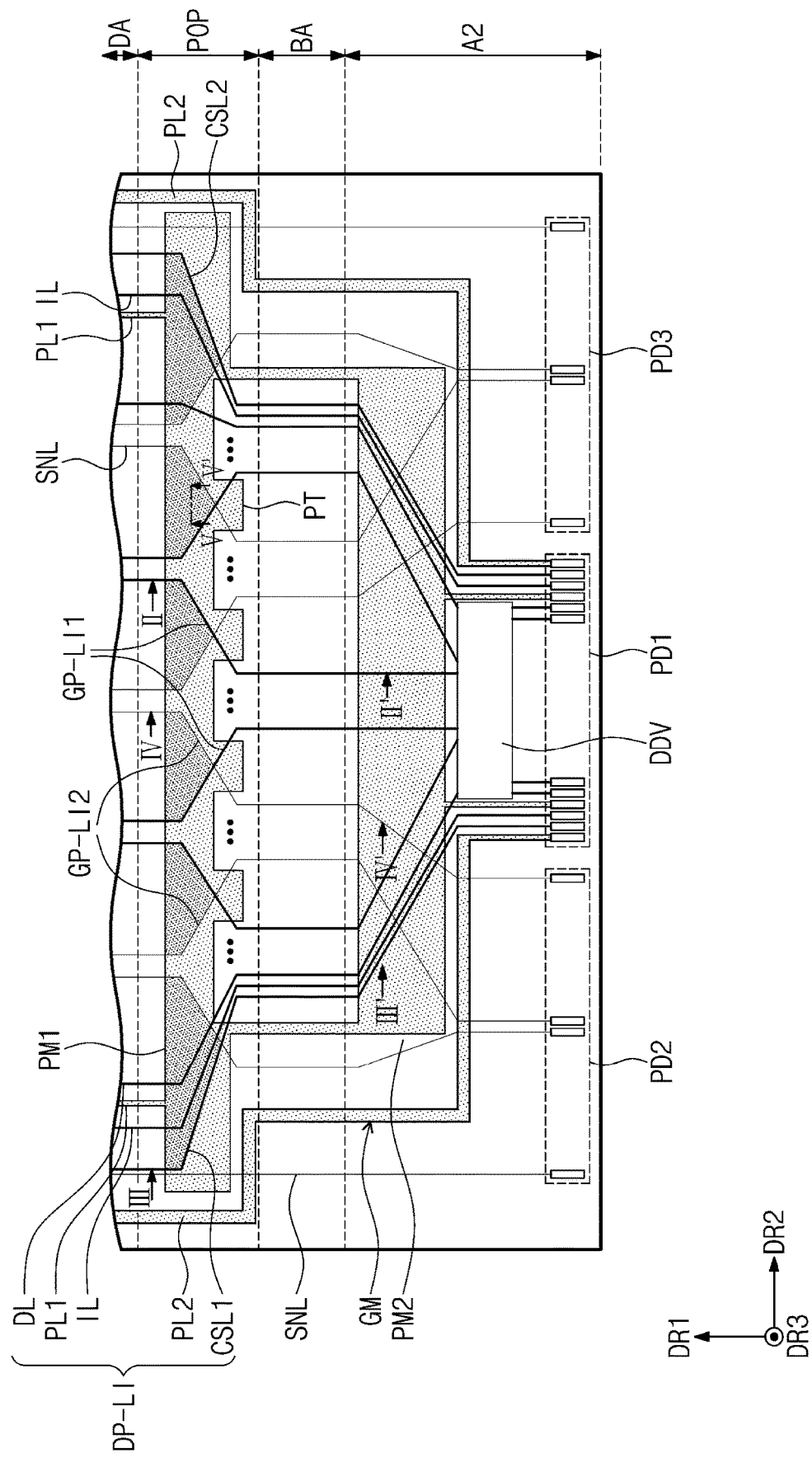
FIG. 9 is an enlarged view of the fan-out part, the bending area, and the second area shown in FIGS. 3 and 6.
Figure 10:
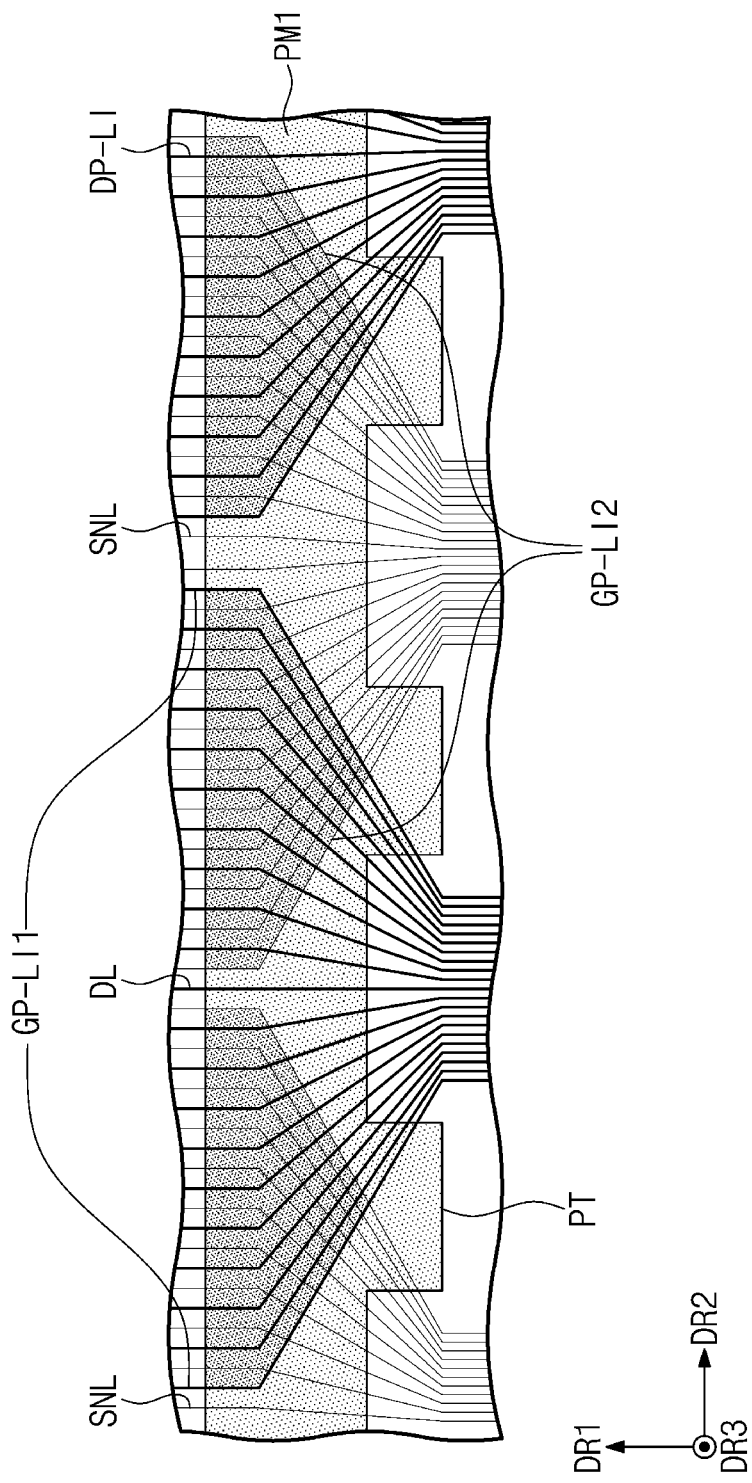
FIG. 10 is a detailed view illustrating wirings of a partial area of the fan-out part shown in FIG. 9.

FIG. 9 is an enlarged view of the fan-out part, the bending area, and the second area shown in FIGS. 3 and 6. FIG. 10 is a detailed view illustrating wirings of a partial area of the fan-out part shown in FIG. 9.

In FIG. 9, the display panel DP and the input sensing portion ISP are overlapped and shown. For convenience of explanation, in FIG. 9, some panel lines DP-LI located on the left side and the right side of each of the first line groups GP-LI1 are illustrated, and sensing lines SNL located on the left side and the right side of each of the second line groups GP-LI2 are illustrated. The detailed arrangement of the panel lines DP-LI and the sensing lines SNL is shown in FIG. 10.

In FIG. 9 and FIG. 10, the panel lines DP-LI are shown as thicker lines than the sensing lines SNL, and the first and second power metals PM1 and PM2 and the second power line PL2 are shown in gray. In addition, in FIG. 9, portions of the first line groups GP-LI1 and the second line groups GP-LI2 overlapping each other are shown in darker gray.

Referring to FIGS. 9 and 10, in the fan-out part POP, the panel lines DP-LI may be grouped into first line groups GP-LI1 and the sensing lines SNL may be grouped into second line groups GP-LI2. The first line groups GP-LI1 and the second line groups GP-LI2 may be alternately arranged in the second direction DR2.

For example, in FIG. 9, three first line groups GP-LI1 and four second line groups GP-LI2 are alternately arranged but the inventive concept is not limited thereto. At least three or more second line groups GP-LI2 may be alternately arranged with at least two or more first line groups GP-LI1.

In the fan-out part POP, the interval between the panel lines DP-LI of each of the first line groups GP-LI1 may become narrower as it goes from the portion adjacent to the display area DA to the portion adjacent to the bending area BA. In the fan-out part POP, the interval between the sensing lines SNL of each of the second line groups GP-LI2 may become narrower as it goes from the portion adjacent to the display area DA to the portion adjacent to the bending area BA.

In the fan-out part POP, the panel lines DP-LI and the sensing lines SNL may be located on different layers to insulate each other. In a plan view, the first line groups GP-LI1 and the second line groups GP-LI2 may partially overlap each other in the part of the fan-out part POP adjacent to the display area DA. In portions of the first and second line groups GP-LI1 and GP-LI2 overlapping each other, the panel lines DP-LI and the sensing lines SNL may extend to intersect each other.

In the bending area BA, the first line groups GP-LI1 and the second line groups GP-LI2 may be alternately spaced apart from each other in the second direction DR2 without overlapping each other. The panel lines DP-LI and the sensing lines SNL may be located on the same layer in the bending area BA. Such a configuration will be described in more detail below.

The display panel DP may include a first power metal PM1 located in the fan-out part POP. The first power metal PM1 may be connected to the pixels PX. For example, the first power lines PL1 extending from the first power metal PM1 may be connected to the pixels PX. The first power metal PM1 may be insulated from the panel lines DP-LI except for the sensing lines SNL and the first power lines PL1 in the fan-out part POP.

In a plan view, the first power metal PM1 may overlap parts of the first and second line groups GP-LI1 and GP-LI2 that overlap each other in the fan-out part POP. The first power metal PM1 may include a plurality of protruding parts PT protruding toward the bending area BA as overlapping portions of the first and second line groups GP-LI1 and GP-LI2 that overlap each other.

The display panel DP may further include a second power metal PM2 extending from the first power metal PM1 and located in the second area A2 through the bending area BA. The second power metal PM2 may be located between the data driver DDV and the bending area BA to extend in the second direction DR2.

In a plan view, a portion of the panel lines DP-LI and a portion of the sensing lines SNL may overlap the second power metal PM2 and extend to intersect each other. A portion of the panel lines DP-LI and a portion of the sensing lines SNL overlapping the second power metal PM2 may be insulated from the second power metal PM2.

The panel lines DP-LI may extend in the second area A2 and may be connected to the first pads PD1, respectively. The sensing lines SNL may extend to the second area A2 and be connected to the second and third pads PD2 and PD3, respectively.

The second power line PL2 may include a ground metal GM. The ground metal GM may be located on the left and right sides of the fan-out part POP and may extend to the second area A2 through the bending area BA. The ground metal GM may be connected to the corresponding first pads PD1 among the first pads PD1 in the second area A2.

As the size of the display device increases and the resolution of the display device increases, the number of wirings may increase. When the number of wirings increases, the area of the fan-out part for arranging the wirings may increase, and as a result, the bezel area may increase.

According to some example embodiments of the inventive concept, the panel lines DL-LI are divided into a plurality of first line groups GP-LI1, the sensing lines SNL are divided into a plurality of second line groups GP-LI2, and the first and second line groups GP-LI1 and GP-LI2 are alternately arranged, so that the area of the fan-out part POP can be reduced. As a result, the bezel area can be reduced.

Figure 11:
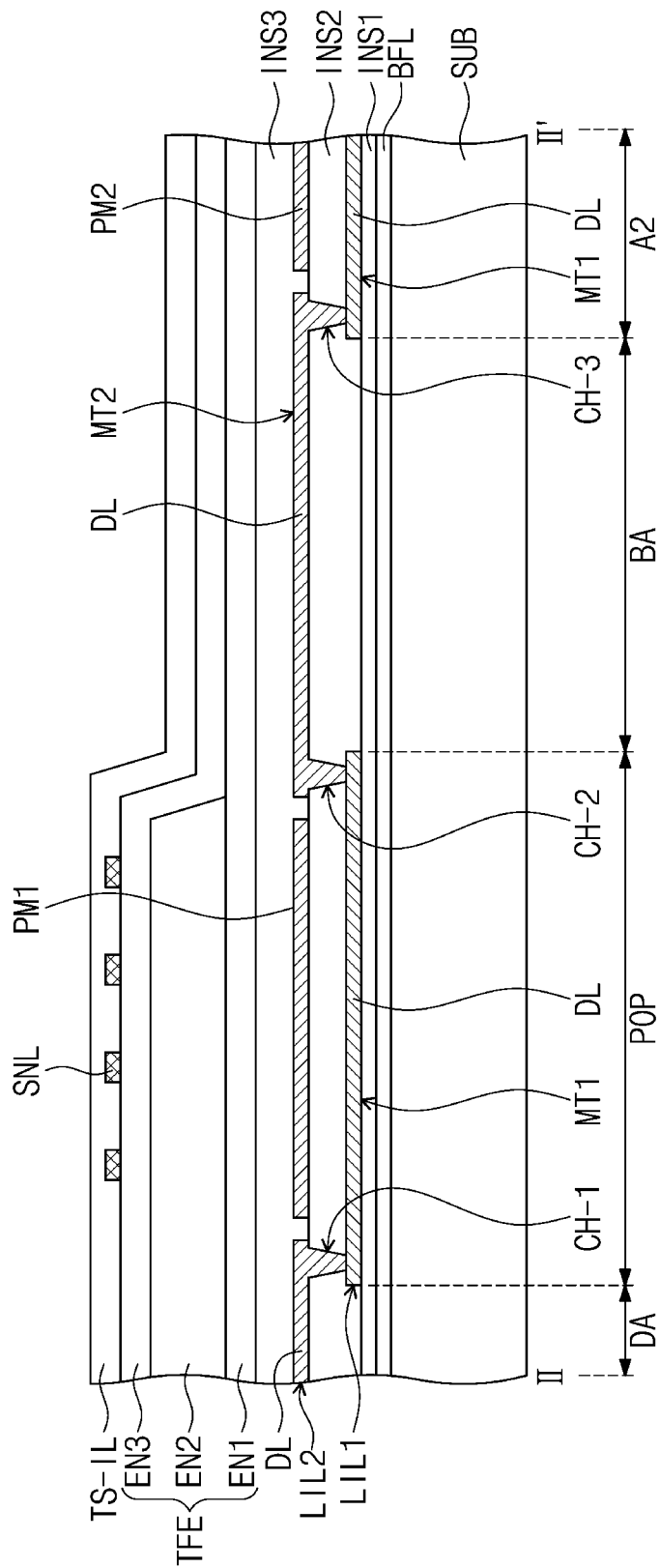
FIG. 11 is a diagram illustrating a cross-sectional configuration of a portion where data lines from point II to point II' shown in FIG. 9 are arranged.

FIG. 11 is a diagram illustrating a cross-sectional configuration of a portion where data lines from point II to point II' shown in FIG. 9 are arranged.

Hereinafter, the layer on the first insulating layer INS1 is defined as the first wiring layer LIL1, and the layer on the second insulating layer INS2 is defined as the second wiring layer LIL2. The second wiring layer LIL2 may be located on the first wiring layer LIL1.

Referring to FIG. 11, the data line DL may be located within the second wiring layer LIL2 in the display area DA, may be located in the first wiring layer LIL1 in the fan-out part POP, may be located in the second wiring layer LIL2 in the bending area BA, and may be located in the first wiring layer LIL1 in the second area A2. The first power metal PM1 and the second power metal PM2 may be located in the second wiring layer LIL2. According to some example embodiments, the ground metal GM may also be located in the second wiring layer LIL2.

The data line DL extending from the display area DA to the fan-out part POP may be located in the first wiring layer LIL1 in the fan-out part POP through the contact hole CH-1 defined in the second insulating layer INS2 in order not to contact the first power metal PM1. For example, the data line DL located in the display area DA may be connected to the first metal electrode MT1 located in the first wiring layer LIL1 in the fan-out part POP.

The data line DL extending from the fan-out part POP to the bending area BA may be located in the second wiring LIL2 in the bending area BA through the contact hole CH-2 defined in the second insulating layer INS2. For example, the data line DL located in the fan-out part POP may be connected to the second metal electrode MT2 located in the second wiring layer LIL2 in the bending area BA.

The data line DL extending from the bending area BA to the second area A2 may be located in the first wiring layer LIL1 through the contact hole CH-3 defined in the second insulating layer INS2 in order not to contact the second power metal PM2. For example, the data line DL located in the bending area BA may be connected to the first metal electrode MT1 located in the first wiring layer LIL1 in the second area A2.

According to some example embodiments, the initialization lines IL may be located on the same layer as the data line DL. Therefore, the initialization lines IL may be located in the second wiring layer LIL2 in the display area DA, may be located in the first wiring layer LIL1 in the fan-out part POP, may be located in the second wiring layer LIL2 in the bending area BA, and may be located in the first wiring layer LIL1 in the second area A2.

First and second power lines PL1 and PL2 extending from the first power metal PM1 and the ground metal GM may also be located in the second wiring layer LIL2.

Figure 12:
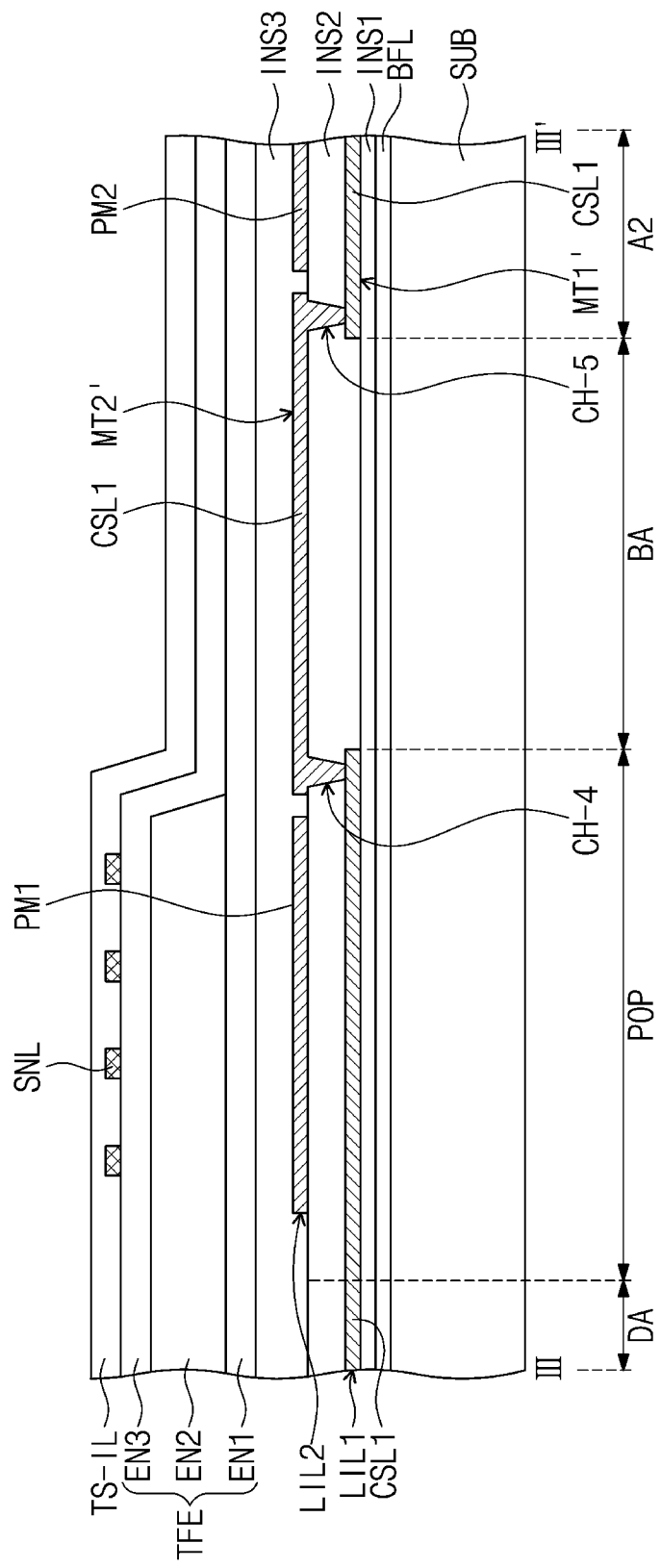
FIG. 12 is a diagram illustrating a cross-sectional configuration of a portion where first control lines from point III to point III' shown in FIG. 9 are arranged.

FIG. 12 is a diagram illustrating a cross-sectional configuration of a portion where first control lines from point III to point III' shown in FIG. 9 are arranged.

Referring to FIG. 12, the first control line CSL1 may be located in the first wiring layer LIL1 in the display area DA and the fan-out part POP, may be located in the second wiring layer LIL2 in the bending area BA, and may be located in the first wiring layer LIL1 in the second area A2.

The first control line CSL1 extending from the fan-out part POP to the bending area BA may be located in the second wiring layer LIL2 in the bending area BA through the contact hole CH-4 defined in the second insulating layer INS2. For example, the first control line CSL1 located in the fan-out part POP may be connected to the second metal electrode MT2' located in the second wiring layer LIL2 in the bending area BA.

The first control line CSL1 extending from the bending area BA to the second area A2 may be located in the first wiring layer LIL1 through the contact hole CH-5 defined in the second insulating layer INS2 in order not to contact the second power metal PM2. For example, the first control line CSL1 located in the bending area BA may be connected to the first metal electrode MT1' located in the first wiring layer LIL1 in the second area A2. According to some example embodiments, the second control line CSL2 may be located on the same layer as the first control line CSL1.

Therefore, the data line DL and the first and second control lines CSL1 and CSL2 may be identically arranged in the first wiring layer LIL1 in the fan-out part POP, may be identically arranged in the second wiring layer LIL2 in the bending area BA, and may be identically arranged in the first wiring layer LIL1 in the second area A2.

Figure 13:
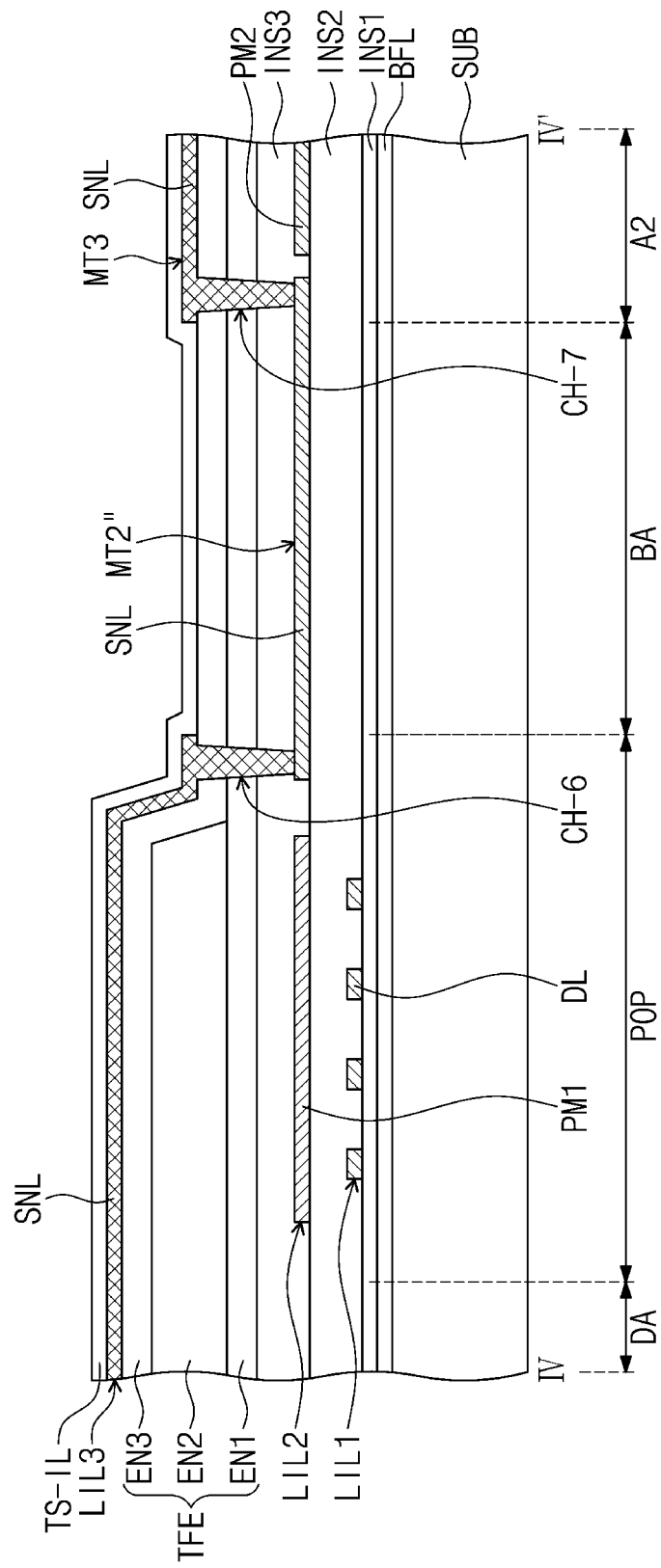
FIG. 13 is a diagram illustrating a cross-sectional configuration of a portion where sensing lines from point IV to point IV' shown in FIG. 9 are arranged.

FIG. 13 is a diagram illustrating a cross-sectional configuration of a portion where sensing lines from point IV to point IV' shown in FIG. 9 are arranged.

Hereinafter, a layer on the thin film encapsulation layer TFE may be defined as a third wiring layer LIL3, and the third wiring layer LIL3 may be located on the second wiring layer LIL2.

Referring to FIG. 13, the sensing line SNL may be located in the third wiring layer LIL3 in the display area DA and the fan-out part POP, may be located in the second wiring layer LIL2 in the bending area BA, and may be located in the third wiring layer LIL3 in the second area A2.

The sensing line SNL extending from the fan-out part POP to the bending area BA may be located in the second wiring layer LIL2 in the bending area BA through the contact hole CH-6 defined in the first and third encapsulation layers EN1 and EN3 and the third insulating layer INS3. For example, the sensing line SNL located in the fan-out part POP may be connected to the second metal electrode MT2'' located in the second wiring layer LIL2 in the bending area BA.

The sensing line SNL extending from the bending area BA to the second area A2 may be located in the third wiring layer LIL3 through the contact hole CH-7 defined in the first and third encapsulation layers EN1 and EN3 and the third insulating layer INS3. For example, the sensing line SNL located in the bending area BA may be connected to the third metal electrode MT3 located in the second wiring layer LIL2 in the second area A2.

Figure 14:
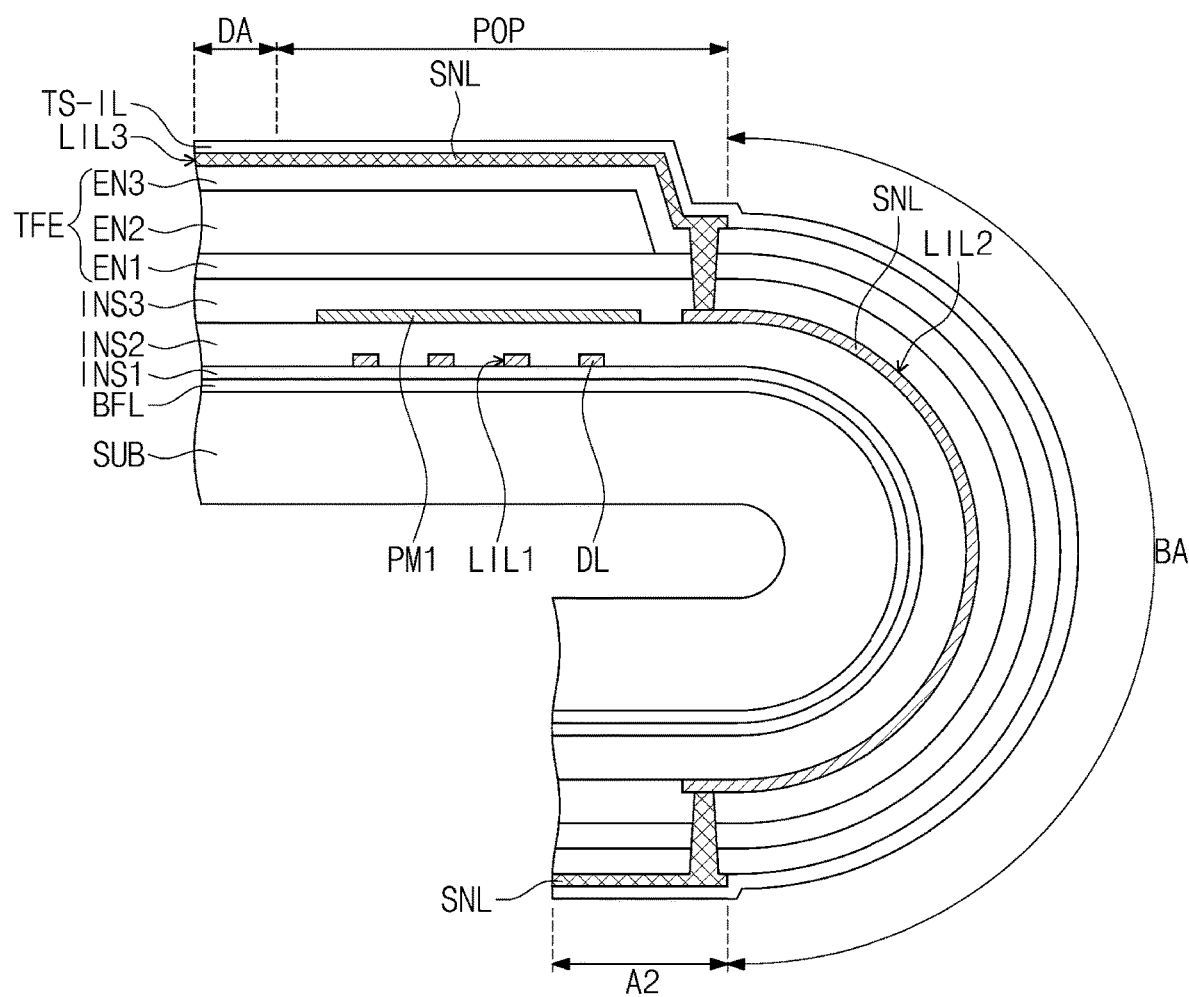

FIG. 14 is a view illustrating a bent state of the bending area illustrated in FIG. 13.

Referring to FIG. 14, the bending area BA may be bent so that the second area A2 is located below the first area A1. Stress may occur in the bending area BA. In the first wiring layer LIL1 located more inward, greater compressive stress may occur, and in the third wiring layer LIL3 located more outward, greater tensile stress may occur. When the wirings are located in the first wiring layer LIL1 or the third wiring layer LIL3 in the bending area BA, the wirings may be damaged by compressive stress and tensile stress.

However, according to some example embodiments of the inventive concept, the wirings such as the sensing line SNL, the data line DL, and the first and second control lines CSL1 and CSL2 may be located in the second wiring layer LIL2 in the bending area BA. Therefore, a relatively smaller compressive stress and a relatively smaller tensile stress than the first wiring layer LIL1 or the third wiring layer LIL3 are generated in the second wiring layer LIL2 so that damage to the wirings located in the second wiring layer LIL2 may be prevented.

Figure 15:
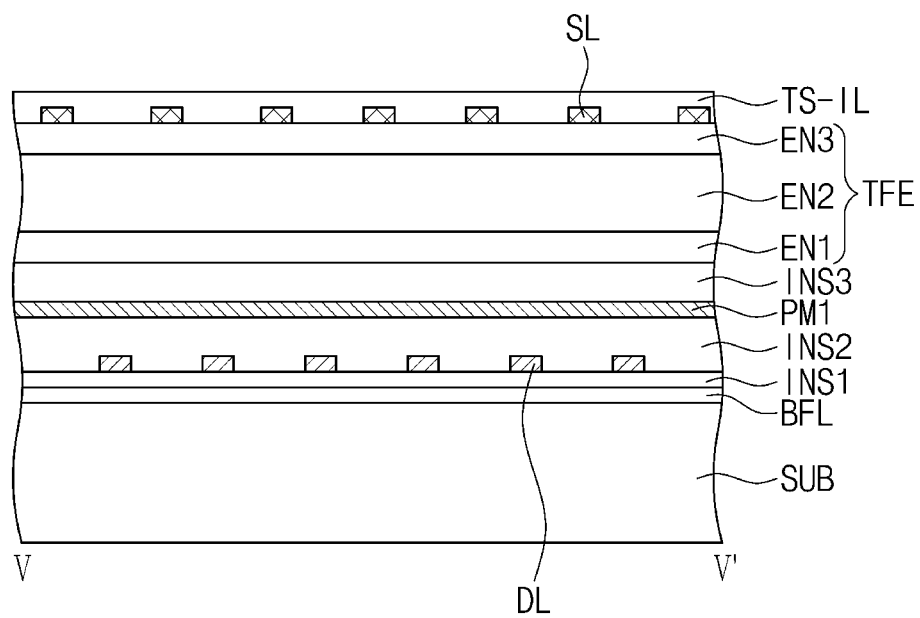
FIG. 15 is a cross-sectional view taken along the line V-V of FIG. 9.

FIG. 15 is a cross-sectional view taken along the line V-V of FIG. 9.

Referring to FIG. 15, a first power metal PM1 may be located between the data lines DL and the sensing lines SNL. The data lines DL may be located below the first power metal PM1 and the sensing lines SNL may be located on the first power metal PM1.

If the first power metal PM1 is not located between the data lines DL and the sensing lines SNL, signals applied to the sensing lines SNL may affect signals applied to the data lines DL. In this case, noise may occur in the display panel DP.

The first power metal PM1 is located between the data lines DL and the sensing lines SNL so that the influence of the signals applied to the sensing lines SNL on the signals applied to the data lines DL may be blocked. Therefore, the first power metal PM1 may reduce noise that may occur in the display panel DP by signals applied to the sensing lines SNL.

According to some example embodiments of the invention, the first power metal PM1 is arranged to overlap portions of the first and second line groups GP-LI1 and GP-LI2 that overlap each other so that noise of the display panel DP can be prevented. Although the first power metal PM1 is illustrated, the second power metal PM2 may also serve as the first power metal PM1 in the second area A2.

Figure 16:
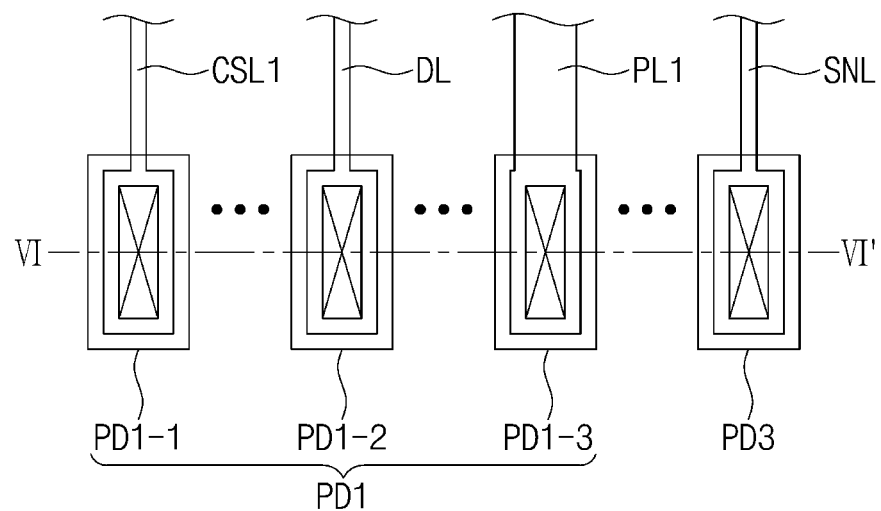
FIG. 16 is a diagram illustrating a configuration in which a first control line, a data line, a first power line, and a sensing line are connected to pads.
Figure 17:
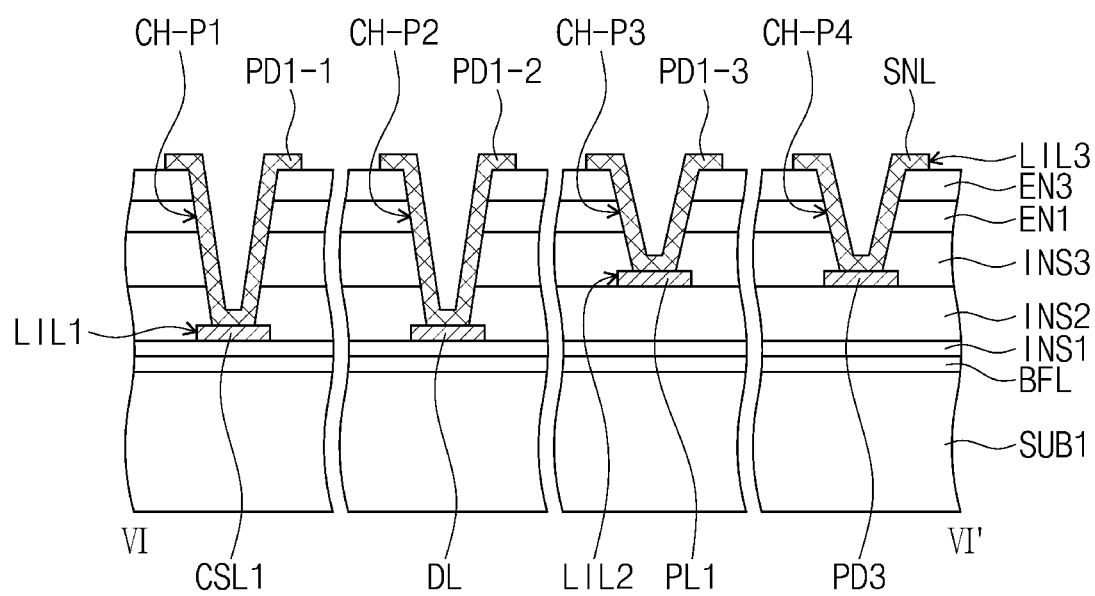
FIG. 17 is a cross-sectional view taken along the line VI-VI' of FIG. 16.

FIG. 16 is a diagram illustrating a configuration in which a first control line, a data line, a first power line, and a sensing line are connected to pads. FIG. 17 is a cross-sectional view taken along the line VI-VI' of FIG. 16.

Referring to FIGS. 16 and 17, in the second area A2, the first control wiring CSL1 located in the first wiring layer LIL1 may be connected to a corresponding first pad PD1-1 among the first pads PD1. The first pad PD1-1 may be connected to the first control wiring CSL1 through the contact holes CH-P1 defined in the second insulating layer INS2, the third insulating layer INS3, and the first and third encapsulation layers EN1 and EN3. According to some example embodiments, the second control wiring CSL2 may also be connected to the corresponding first pad PD1 in the same structure as the first control wiring CSL1.

In the second area A2, the data line DL located in the first wiring layer LIL1 may be connected to a corresponding first pad PD1-2 among the first pads PD1. The first pad PD1-2 may be connected to the data line DL through the contact holes CH-P2 defined in the second insulating layer INS2, the third insulating layer INS3, and the first and third encapsulation layers EN1 and EN3. According to some example embodiments, the initialization line IL may also be connected to the corresponding first pad PD1 in the same structure as the data line DL.

In the second area A2, the first power line PL1 may extend from the second power metal PM2. The first power line PL1 located in the second wiring layer LIL2 may be connected to the corresponding first pad PD1-3 among the first pads PD1. The first pad PD1-3 may be connected to the first power line PL1 through the contact hole CH-P3 defined in the third insulating layer INS3 and the first and third encapsulation layers EN1 and EN3. According to some example embodiments, the second power line PL2 may also be connected to the corresponding first pad PD1 in the same structure as the first power line PL1.

In the second area A2, the sensing line SNL located in the third wiring layer LIL3 may be connected to the corresponding third pad PD3. The third pad PD3 may be located in the second wiring layer LIL2, but is not limited thereto. The third pad PD3 may be located in the first wiring layer LIL1.

The sensing line SNL may be connected to the third pad PD3 through the contact hole CH-P4 defined in the third insulating layer INS3 and the first and third encapsulation layers EN1 and EN3. According to some example embodiments, the second pads PD2 may also be located in the second wiring layer LIL2 and connected to the corresponding sensing lines SNL.

Figure 18:
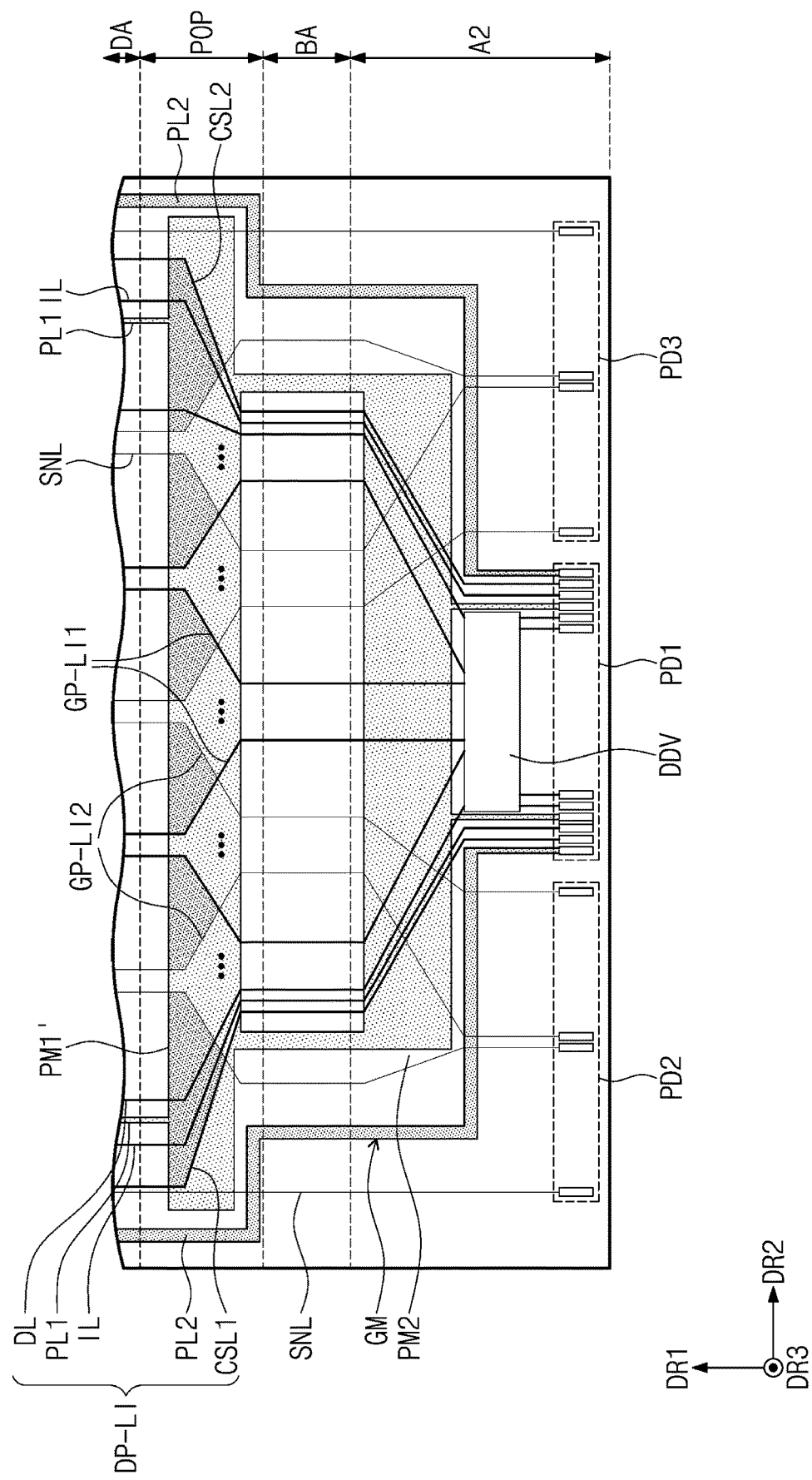
FIG. 18 is a diagram illustrating a configuration of a display device according to some example embodiments of the inventive concept.

FIG. 18 is a diagram illustrating a configuration of a display device according to some example embodiments of the inventive concept.

FIG. 18 is a plan view corresponding to FIG. 9. Except for the shape of the first power metal PM1', the configuration shown in FIG. 18 is substantially the same as the configuration shown in FIG. 9.

Referring to FIG. 18, the first power metal PM1' may not include protruding parts PT unlike the first power metal PM1 shown in FIG. 9. One side of the first power metal PM1' facing the bending area BA may be located adjacent to the bending area BA. One side of the first power metal PM1' may extend in parallel with an extension direction of the bending area BA. For example, one side of the first power metal PM1' may extend in the second direction DR2.

The first power metal PM1' may overlap portions of the first line groups GP-LI1 and the second line groups GP-LI2 that overlap each other. The first power metal PM1' may prevent noise that may occur in the display panel DP like the first power metal PM1.

Figure 19:
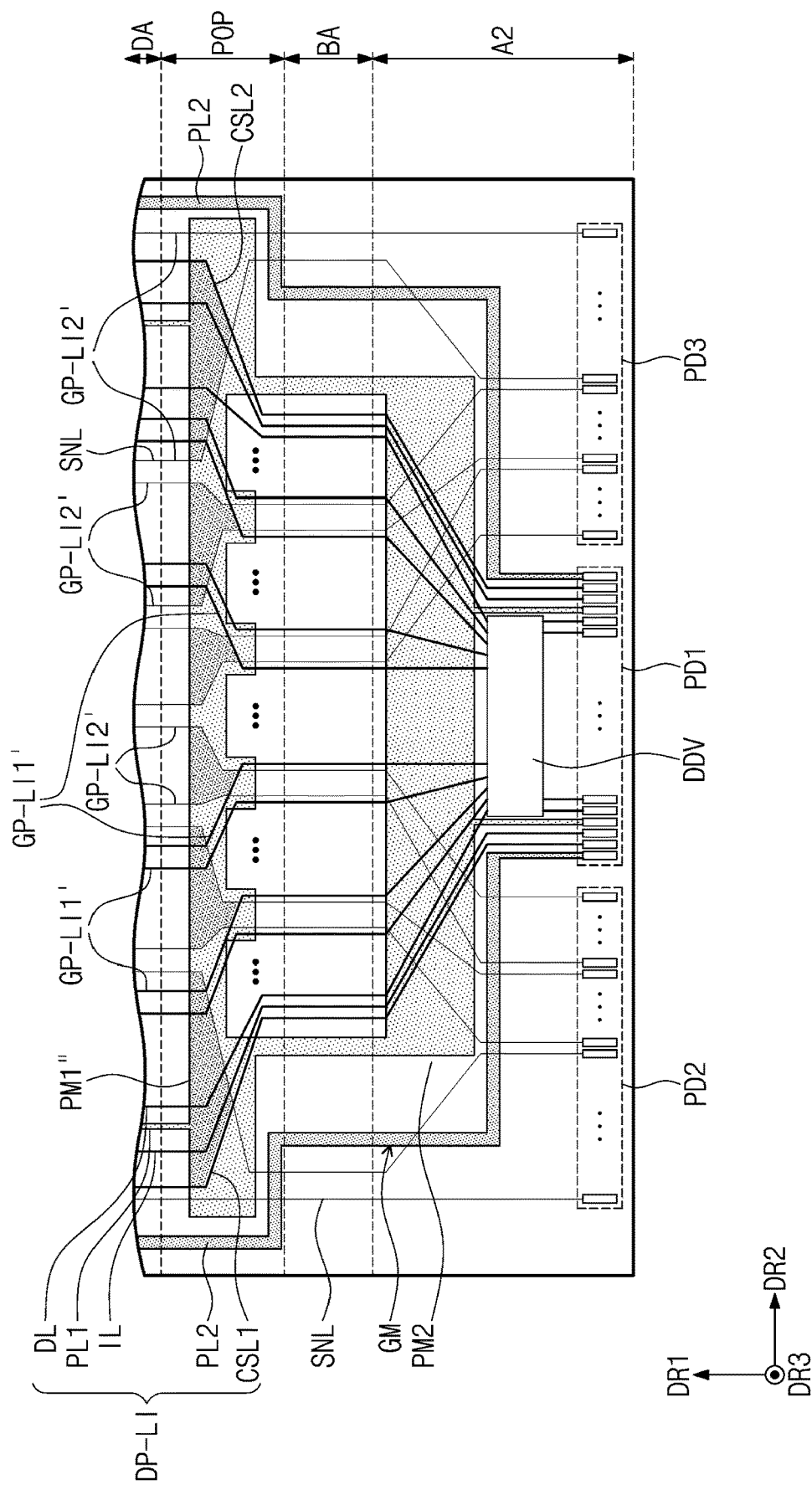
FIG. 19 is a diagram illustrating a configuration of a display device according to some example embodiments of the inventive concept.
Figure 20:
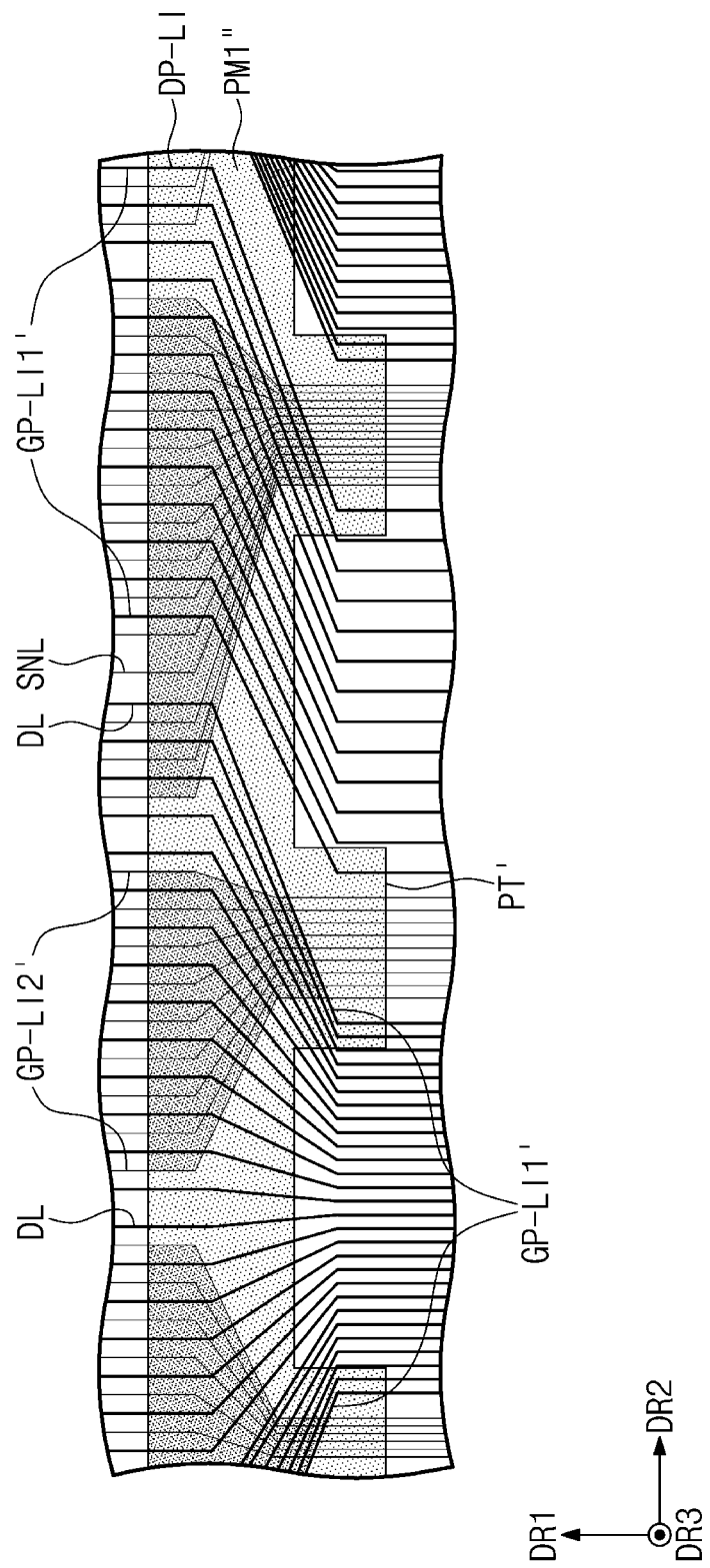
FIG. 20 is a detailed view illustrating wirings of a partial area of the fan-out part shown in FIG. 9.

FIG. 19 is a diagram illustrating a configuration of a display device according to some example embodiments of the inventive concept. FIG. 20 is a detailed view illustrating wirings of a partial area of the fan-out part shown in FIG. 9.

FIG. 19 is shown in a plan view corresponding to FIG. 9. Hereinafter, the configuration shown in FIGS. 19 and 20 will be described with reference to the configuration different from the configuration shown in FIGS. 9 and 10.

Referring to FIGS. 19 and 20, in the fan-out part POP, the panel lines DP-LI may be grouped into first line groups GP-LI1' and the sensing lines SNL may be grouped into second line groups GP-LI2'. The first line groups GP-LI1' and the second line groups GP-LI2' may be alternately arranged in the second direction DR2.

The interval between the panel lines DP-LI of each of the first line groups GP-LI1' may become narrower as it goes from the portion adjacent to the display area DA to the portion adjacent to the bending area BA. The interval between the sensing lines SNL of each of the second line groups GP-LI2' may become narrower as it is toward the bending area BA in a portion adjacent to the display area DA.

The first line groups GP-LI1' and the second line groups GP-LI2' may partially overlap each other in the fan-out part POP. In portions of the first and second line groups GP-LI1' and GP-LI2' overlapping each other, the panel lines DP-LI and the sensing lines SNL may extend to intersect each other.

The first line groups GP-LI1' may include a center part CTP having a fan shape and a plurality of inclined parts ICL extending in a diagonal direction along a left and right boundary of a fan shape with the central portion CTP therebetween. The interval between the center part CTP and the panel lines DP-LI of each of the inclined parts ICL may become narrower as it goes from the portion adjacent to the display area DA to the portion adjacent to the bending area BA.

In the bending area BA, the first line groups GP-LI1' and the second line groups GP-LI2' may be alternately spaced apart from each other in the second direction DR2 without overlapping each other.

The first power metal PM1" may be located in the fan-out part POP. The first power metal PM1" may overlap portions of the first and second line groups GP-LI1' and GP-LI2' overlapping each other. The first power metal PM1" may include a plurality of protruding parts PT' protruding toward the bending area BA as overlapping portions of the first and second line groups GP-LI1' and GP-LI2' that overlap each other.

The second power metal PM2 extending from the first power metal PM1" is located between the data driver DDV and the bending area BA in the second area A2 and extends in the second direction DR2.

In a plan view, in the second area A2, a portion of the panel lines DP-LI and a portion of the sensing lines SNL may overlap the second power metal PM2 and extend to intersect each other. The panel lines DP-LI are connected to the first pads PD1 in the second area A2, and the sensing lines SNL are connected to the second and third pads PD2 and PD3 in the second area A2.

According to some example embodiments of the inventive concept, the panel lines are divided into a plurality of first line groups, the sensing lines are divided into a plurality of second line groups, and the first and second line groups are alternately arranged, so that the area of the fan-out part can be reduced. As a result, the bezel area can be reduced.

Although aspects of some example embodiments of the inventive concept have been described, it is understood that the inventive concept should not be limited to these example embodiments but various changes and modifications can be made by one ordinary skilled in the art within the spirit and scope of the inventive concept as defined in the appended claims and their equivalents.

What is claimed is:

1. A display device comprising:
    a display panel comprising a plurality of pixels and a plurality of panel lines connected to the pixels;
    a plurality of sensing electrodes on the display panel;
    a plurality of sensing lines connected to the sensing electrodes on the display panel; and
    a plurality of pads connected to the panel lines and the sensing lines,
    wherein, at a fan-out part between the pixels and the pads, the panel lines are grouped into a plurality of first line groups, the sensing lines are grouped into a plurality of second line groups, the first line groups and the second line groups are alternately arranged and fan out portions of the first line groups having a fan shape and fan out portions of the second line groups having the fan shape partially overlap at the fan-out part, and each of the second line groups extend to fan out toward corresponding pads of the pads.

2. The display device of claim 1, wherein the sensing lines are grouped into at least three or more second line groups.

3. The display device of claim 1, wherein the display panel comprises:
    a first area comprising a display area and a non-display area around the display area;
    a second area in which the pads are located; and
    a bending area between the first area and the second area,
    wherein the fan-out part is defined as a portion of the non-display area between the bending area and the display area.

4. The display device of claim 3, wherein, at the fan-out part, an interval between the panel lines of each of the first line groups becomes narrower as it goes from a portion adjacent to the display area to a portion adjacent to the bending area.

5. The display device of claim 3, wherein, at the fan-out part, an interval between the sensing lines of each of the second line groups becomes narrower as it goes from a portion adjacent to the display area to a portion adjacent to the bending area.

6. The display device of claim 3, wherein the first line groups and the second line groups are alternately spaced apart from each other without overlapping each other in the bending area.

7. The display device of claim 3, wherein the display panel further comprises a first power metal on the fan-out part and connected to the pixels.

8. The display device of claim 7, wherein in a plan view, the first power metal overlaps portions of the first and second line groups that overlap each other in the fan-out part.

9. The display device of claim 8, wherein the first power metal comprises a plurality of protruding parts protruding toward the bending area as overlapping portions of the first and second line groups that overlap each other.

10. The display device of claim 7, wherein the display panel further comprises a second power metal extending from the first power metal and in the second area through the bending area.

11. The display device of claim 10, wherein in a plan view, a portion of the panel lines and a portion of the sensing lines in the second area overlap the second power metal and extend to intersect each other.

12. The display device of claim 7, wherein one side of the first power metal facing the bending area extends in parallel with the bending area.

13. The display device of claim 7, wherein the panel lines comprise data lines connected to the pixels,
    wherein, at the fan-out part, the data lines are in a first wiring layer, the first power metal is in a second wiring layer on the first wiring layer, and the sensing lines are in a third wiring layer on the second wiring layer.

14. The display device of claim 13, wherein, at the bending area, the data lines and the sensing lines are in the second wiring layer.

15. The display device of claim 13, wherein, at the second area, the data lines are in the first wiring layer, and the sensing lines are in the third wiring layer.

16. The display device of claim 3, wherein the pads comprise:
    a plurality of first pads connected to the panel lines; and
    a plurality of second pads and a plurality of third pads connected to the sensing lines,
    wherein the first pads are between the second pads and the third pads.

17. The display device of claim 16, further comprising a driving chip in the second area,
    wherein data lines among the panel lines are connected to the first pads through the driving chip,
    wherein the bending area is bent such that the second area is below the first area.

18. The display device of claim 3, wherein the first line groups comprise:
    a center part having a fan shape; and
    a plurality of inclined parts extending in a diagonal direction along a left and right boundary of the fan shape with the center part interposed therebetween.

19. The display device of claim 18, wherein, at the fan-out part, an interval between the panel lines of each of the center part and the inclined parts becomes narrower as it goes from a portion adjacent to the display area to a portion adjacent to the bending area,
    wherein, at the fan-out part, an interval between the sensing lines of each of the second line groups becomes narrower as it goes downward in a portion of the fan-out part adjacent to the display area.

20. The display device of claim 1, wherein the display panel further comprises a thin film encapsulation layer on the pixels,
    wherein the sensing electrodes are in contact with the thin film encapsulation layer.

21. A display device comprising:
    a display panel comprising a plurality of pixels and a plurality of panel lines connected to the pixels;
    a plurality of sensing electrodes on the display panel;
    a plurality of sensing lines connected to the sensing electrodes on the display panel;
    a plurality of pads connected to the panel lines and the sensing lines; and
    a first power metal in a fan-out part between the pixels and the pads and connected to the pixels,
    wherein, at the fan-out part, the panel lines are grouped into a plurality of first line groups and the sensing lines are grouped into a plurality of second line groups, and fan out portions of the first line groups having a fan shape and fan out portions of the second line groups having the fan shape partially overlap at the fan-out part,
    wherein in a plan view, the first power metal overlaps portions of the first and second line groups that overlap each other, and each of the second line groups extend to fan out toward corresponding pads of the pads.

22. The display device of claim 21, wherein the display panel comprises:
   a first area comprising a display area and a non-display area around the display area;
   a second area in which the pads are located; and
   a bending area between the first area and the second area,
   wherein the fan-out part is defined as a portion of the non-display area between the bending area and the display area,
   wherein the first line groups and the second line groups are alternately arranged and partially overlap each other at a portion of the fan-out part adjacent to the display area.

* * * * *